(12) United States Patent
Yu et al.

(10) Patent No.: US 10,629,477 B2
(45) Date of Patent: Apr. 21, 2020

(54) RAISED VIA FOR TERMINAL CONNECTIONS ON DIFFERENT PLANES

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Chi-Hsi Wu, Hsinchu (TW); Der-Chyang Yeh, Hsinchu (TW); Ming Shih Yeh, Hsinchu (TW); Jing-Cheng Lin, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/416,965

(22) Filed: May 20, 2019

(65) Prior Publication Data
US 2019/0273018 A1    Sep. 5, 2019

Related U.S. Application Data

(63) Continuation of application No. 15/640,949, filed on Jul. 3, 2017, now Pat. No. 10,297,494.
(Continued)

(51) Int. Cl.
*H01L 21/768* (2006.01)
*H01L 23/522* (2006.01)
(Continued)

(52) U.S. Cl.
CPC ...... *H01L 21/76805* (2013.01); *H01L 21/486* (2013.01); *H01L 21/4853* (2013.01);
(Continued)

(58) Field of Classification Search
CPC ........... H01L 21/76805; H01L 21/4853; H01L 23/5226; H01L 24/28; H01L 23/481;
(Continued)

(56) References Cited

U.S. PATENT DOCUMENTS 7,172,945 B2    2/2007    Shioga et al.
7,538,375 B2    5/2009    Kim et al.
(Continued)

FOREIGN PATENT DOCUMENTS

CN    1971877 A    5/2007
CN    104054171 A    9/2014
(Continued)

OTHER PUBLICATIONS

"The Authoritative Dictionary of IEEE StandardTerms," 7th Edition, Dec. 11, 2000, p. 112.

*Primary Examiner* — Selim U Ahmed
*Assistant Examiner* — Evan G Clinton
(74) *Attorney, Agent, or Firm* — Slater Matsil, LLP

(57) ABSTRACT

A method includes forming a metal layer extending into openings of a dielectric layer to contact a first metal pad and a second metal pad, and bonding a bottom terminal of a component device to the metal layer. The metal layer has a first portion directly underlying and bonded to the component device. A raised via is formed on the metal layer, and the metal layer has a second portion directly underlying the raised via. The metal layer is etched to separate the first portion and the second portion of the metal layer from each other. The method further includes coating the raised via and the component device in a dielectric layer, revealing the raised via and a top terminal of the component device, and forming a redistribution line connecting the raised via to the top terminal.

20 Claims, 34 Drawing Sheets

Related U.S. Application Data

(60) Provisional application No. 62/450,786, filed on Jan. 26, 2017.

(51) Int. Cl.
    *H01L 23/538* (2006.01)
    *H01L 23/498* (2006.01)
    *H01L 23/48* (2006.01)
    *H01L 23/00* (2006.01)
    *H01L 21/48* (2006.01)

(52) U.S. Cl.
    CPC ...... *H01L 21/76813* (2013.01); *H01L 23/481* (2013.01); *H01L 23/49827* (2013.01); *H01L 23/5222* (2013.01); *H01L 23/5226* (2013.01); *H01L 23/5384* (2013.01); *H01L 24/24* (2013.01); *H01L 24/27* (2013.01); *H01L 24/28* (2013.01); *H01L 24/73* (2013.01); *H01L 24/82* (2013.01); *H01L 24/13* (2013.01); *H01L 24/32* (2013.01); *H01L 24/48* (2013.01); *H01L 2224/04042* (2013.01); *H01L 2224/05548* (2013.01); *H01L 2224/05567* (2013.01); *H01L 2224/244* (2013.01); *H01L 2224/24147* (2013.01); *H01L 2224/29144* (2013.01); *H01L 2224/29147* (2013.01); *H01L 2224/32145* (2013.01); *H01L 2224/32265* (2013.01); *H01L 2224/73215* (2013.01); *H01L 2224/73217* (2013.01); *H01L 2224/73227* (2013.01); *H01L 2224/73267* (2013.01); *H01L 2224/821* (2013.01); *H01L 2224/82051* (2013.01); *H01L 2224/82951* (2013.01); *H01L 2224/83191* (2013.01); *H01L 2224/83815* (2013.01); *H01L 2224/83895* (2013.01)

(58) Field of Classification Search
    CPC ........... H01L 23/49827; H01L 23/5384; H01L 21/486; H01L 28/40–92
    See application file for complete search history.

(56) References Cited

U.S. PATENT DOCUMENTS

| | | | |
|---|---|---|---|
| 7,808,030 | B2 | 10/2010 | Mizuno et al. |
| 7,936,568 | B2 | 5/2011 | Mashino |
| 9,355,936 | B2 | 5/2016 | Cooney, III et al. |
| 9,859,218 | B1* | 1/2018 | Patlolla ............. H01L 23/53238 |
| 10,262,952 | B2 | 4/2019 | Chen et al. |
| 2005/0095781 | A1 | 5/2005 | Papa Rao et al. |
| 2007/0222030 | A1 | 9/2007 | Salama et al. |
| 2010/0025817 | A1 | 2/2010 | Mihara |
| 2010/0295149 | A1 | 11/2010 | Summerfelt et al. |
| 2012/0025370 | A1 | 2/2012 | Wholey et al. |
| 2012/0142177 | A1 | 6/2012 | Kim et al. |
| 2014/0048951 | A1* | 2/2014 | Lin ....................... H01L 23/481 257/774 |
| 2015/0214128 | A1 | 7/2015 | Lin et al. |
| 2015/0279776 | A1 | 10/2015 | Hu et al. |
| 2017/0250205 | A1 | 8/2017 | Yamazaki |
| 2018/0061697 | A1* | 3/2018 | Yamada ............ H01L 21/76846 |

FOREIGN PATENT DOCUMENTS

| | | |
|---|---|---|
| JP | 2003197463 A | 7/2003 |
| JP | 2008042118 A | 2/2008 |
| KR | 100729360 B1 | 6/2007 |
| KR | 20150137967 A | 12/2015 |

\* cited by examiner

US 10,629,477 B2

RAISED VIA FOR TERMINAL CONNECTIONS ON DIFFERENT PLANES

PRIORITY CLAIM

This application is a continuation of U.S. patent application Ser. No. 15/640,949, entitled "Raised-Via for Terminal Connections on Different Planes," filed Jul. 3, 2017, which claims the benefit of the following provisionally filed U.S. Patent application: Application Ser. No. 62/450,786, filed Jan. 26, 2017, and entitled "Raised-Via for Terminal Connections on Different Planes," which applications are hereby incorporated herein by reference.

BACKGROUND

Passive devices are commonly used in integrated circuits. Passive devices may include capacitors, inductors, or the like. These devices sometimes require large chip area, and are sometimes handled differently from other types of devices such as transistors and resistors. For example, the passive devices may be formed as discrete device dies, which may be bonded on package substrates, Printed Circuit Boards (PCBs), or packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
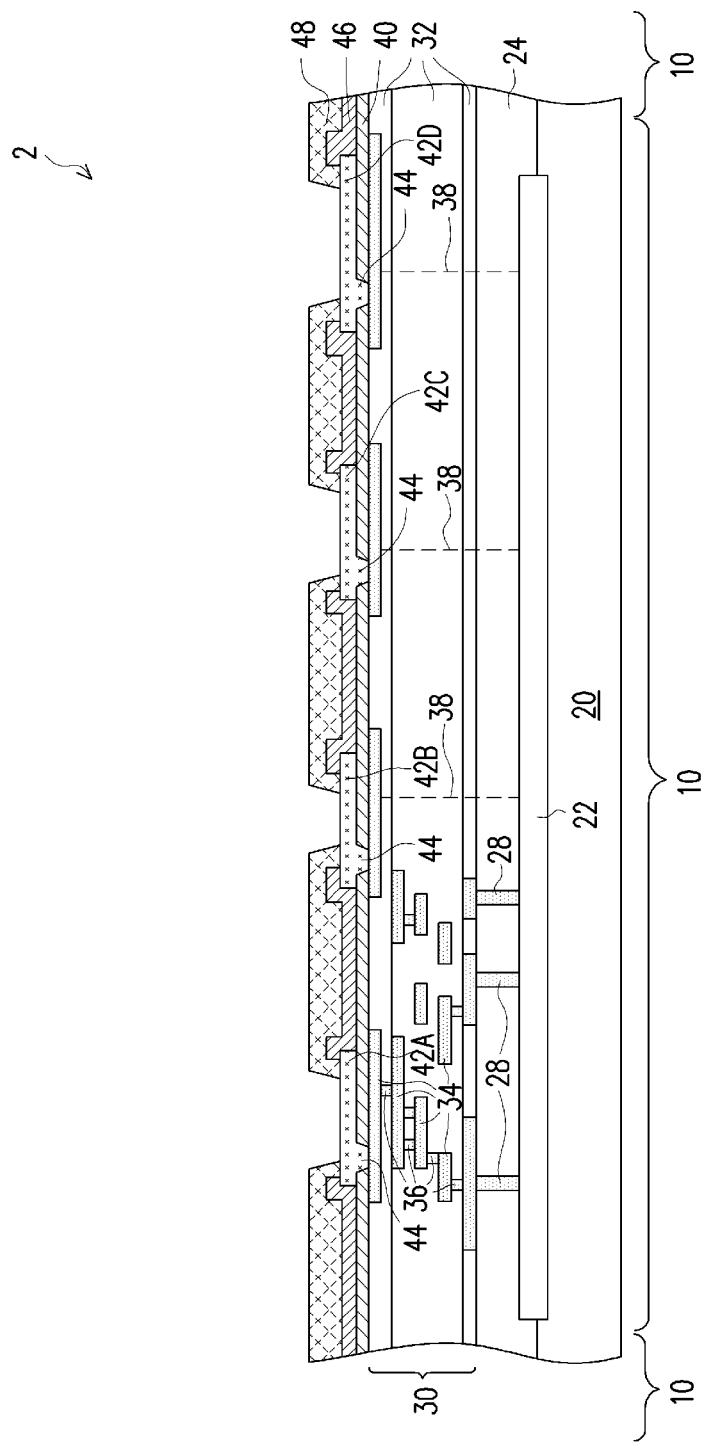
FIGS. 1 through 11 illustrate the cross-sectional views of intermediate stages in the formation of a package integrated with a component device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages including device dies integrated with component devices and the method of forming the same are provided in accordance with various exemplary embodiments. The intermediate stages of forming some packages are illustrated in accordance with some embodiments. Some variations of some embodiments are discussed. Throughout the various views and illustrative embodiments, like reference numbers are used to designate like elements.

Figure 33:
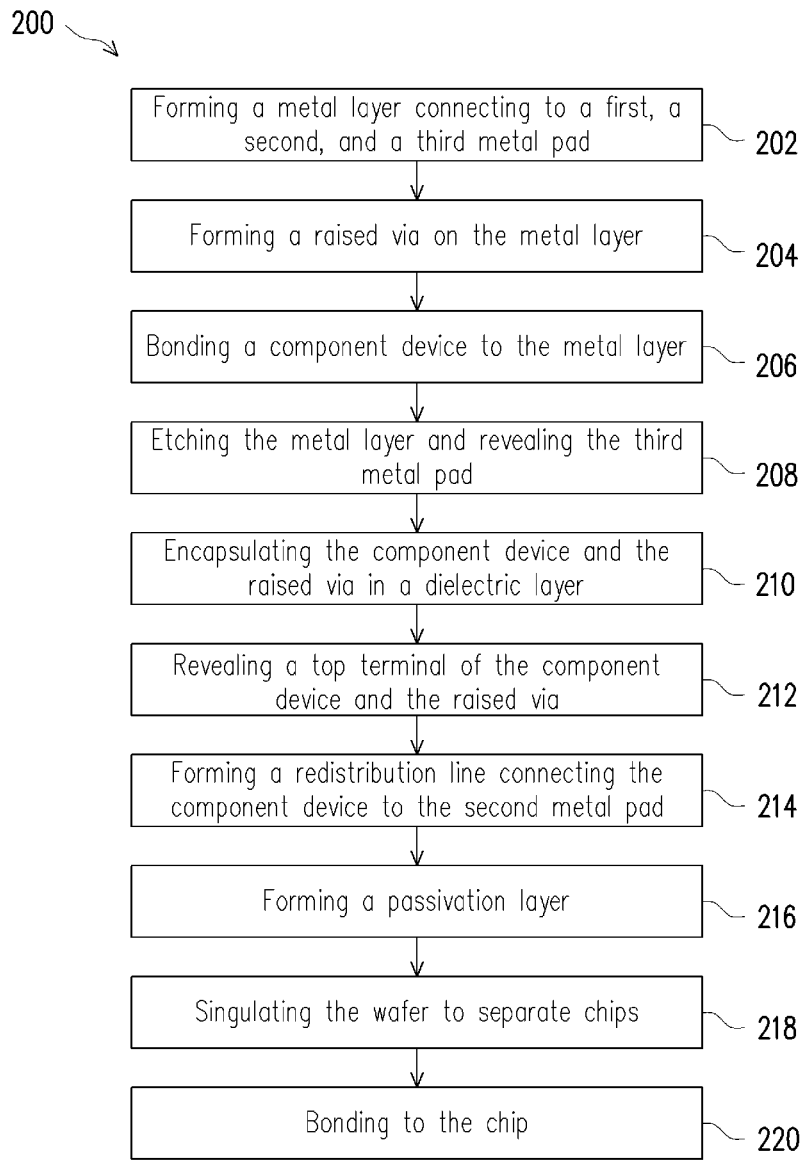
FIG. 33 illustrates a process flow for forming a package in accordance with some embodiments.

FIGS. 1 through 11 illustrate the cross-sectional views of intermediate stages in the formation of a package in accordance with some embodiments of the present disclosure. The steps shown in FIGS. 1 through 11 are also reflected schematically in the process flow 200 as shown in FIG. 33.

FIG. 1 illustrates a cross-sectional view of wafer 2. In accordance with some embodiments of the present disclosure, wafer 2 includes active devices such as transistors and/or diodes, and possibly passive devices such as capacitors, inductors, resistors, or the like. In accordance with alternative embodiments of the present disclosure, package component 2 is an interposer wafer, which does not include active devices, and may or may not include passive devices. Wafer 2 includes a plurality of chips 10.

Wafer 2 may include semiconductor substrate 20 and the features formed at a top surface of semiconductor substrate 20. Semiconductor substrate 20 may be formed of silicon, germanium, silicon germanium, and/or a III-V compound semiconductor such as GaAsP, AlInAs, AlGaAs, GaInAs, GaInP, GaInAsP, or the like. Semiconductor substrate 20 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 20.

In accordance with some embodiments of the present disclosure, wafer 2 includes integrated circuit devices (circuits) 22, which are formed on the top surface of semiconductor substrate 20. Exemplary integrated circuit devices 22 include Complementary Metal-Oxide Semiconductor (CMOS) transistors, resistors, capacitors, diodes, and the like. The details of integrated circuit devices 22 are not illustrated herein. In accordance with alternative embodiments, wafer 2 is used for forming interposers, wherein substrate 20 may be a semiconductor substrate or a dielectric substrate.

Inter-Layer Dielectric (ILD) 24 is formed over semiconductor substrate 20 and fills the space between the gate stacks of transistors (not shown) in integrated circuit devices 22. In accordance with some exemplary embodiments, ILD 24 is formed of Tetra Ethyl Ortho Silicate (TEOS) oxide ($SiO_2$), Phospho-Silicate Glass (PSG), Boro-Silicate Glass (BSG), Boron-doped Phospho-Silicate Glass (BPSG), Fluorine-Doped Silicate Glass (FSG), or the like. ILD 24 may be formed using spin coating, Flowable Chemical Vapor Deposition (FCVD), or the like. In accordance with alternative embodiments of the present disclosure, ILD 24 is formed using a deposition method such as Plasma-Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines and vias. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP) or mechanical grinding) to level the top surfaces of contact plugs 28 with the top surface of ILD 24.

Over ILD 24 and contact plugs 28 is interconnect structure 30. Interconnect structure 30 includes metal lines 34 and vias 36, which are formed in dielectric layers 32. The combination of metal lines at a same level is referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. In accordance with some embodiments of the present disclosure, dielectric layers 32 are formed of low-k dielectric materials. The dielectric constants (k values) of the low-k dielectric materials may be lower than about 3.0, or lower than about 2.5, for example.

Dielectric layers 32 are alternatively referred to as Inter-Metal Dielectric (IMD) layer 32 hereinafter. In accordance with some embodiments of the present disclosure, IMD layers 32 are formed of a low-k dielectric material(s) having a dielectric constant(s) (k-value) lower than about 3.0, about 2.5, or lower. IMD layers 32 may be formed of Black Diamond (a registered trademark of Applied Materials Inc.), a carbon-containing low-k dielectric material, Hydrogen Silses-Quioxane (HSQ), Methyl-Silses-Quioxane (MSQ), or the like. In accordance with some embodiments of the present disclosure, the formation of IMD layers 32 includes depositing a porogen-containing dielectric material and then performing a curing process to drive out the porogen, and hence the remaining IMD layers 32 are porous.

The formation process of metal lines 34 and vias 36 may include single damascene and/or dual damascene processes. In an exemplary single damascene process, a trench is first formed in one of IMD layers 32, followed by filling the trench with a conductive material. A planarization step such as CMP is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. A conductive material is then filled into the trench and the via opening to form a metal line and a via, respectively. The conductive material may include a diffusion barrier layer and a copper-containing metallic material over the diffusion barrier layer, wherein the barrier layer may include titanium, titanium nitride, tantalum, tantalum nitride, or the like.

Passivation layer 40 (sometimes referred to as passivation-1) may be formed over interconnect structure 30, wherein vias 44 are formed in passivation layer 40 to electrically connect metal lines 34 and vias 36 to overlying metal pads.

Metal pads 42 (including 42A, 42B, 42C, and 42D, which are collectively referred to as metal pads 42) are formed over passivation layer 40, and may be electrically coupled to integrated circuit devices 22 through vias 44 in passivation layer 40, and through metal lines 34 and vias 36 in accordance with some exemplary embodiments. Metal pads 42 may be aluminum pads or aluminum-copper pads, and other metallic materials may be used. The electrical coupling from metal pads 42B, 42C, and 42D to integrated circuit devices 22 are schematically represented by dashed lines 38.

Passivation layer 46 (sometimes referred to as passivation-2) is formed over passivation layer 40. Some portions of passivation layer 46 may cover the edge portions of metal pads 42, and central portions of metal pads 42 are exposed through the openings in passivation layer 46. Each of passivation layers 40 and 46 may be a single layer or a composite layer, and may be formed of a non-porous material. In accordance with some embodiments of the present disclosure, one or both of passivation layers 40 and 46 is a composite layer including a silicon oxide layer (not shown), and a silicon nitride layer (not shown) over the silicon oxide layer. Passivation layers 40 and 46 may also be formed of other non-porous dielectric materials such as Un-doped Silicate Glass (USG), silicon oxynitride, and/or the like.

Dielectric layer 48 is formed over passivation layer 46. In accordance with some embodiments of the present disclosure, dielectric layer 48 is a polymer layer, and hence is referred to as polymer layer 48 throughout the description, while it can be formed of an inorganic dielectric material such as silicon nitride, silicon oxide, or the like. Polymer layer 48 may be formed of polyimide, PolyBenzOxazole (PBO), BenzoCycloButene (BCB), or the like. The formation methods may include spin coating, for example. Polymer layer 48 may be dispensed in a flowable form, and then cured. Polymer layer 48 is patterned to expose the center portions of metal pads 42.

Figure 2:
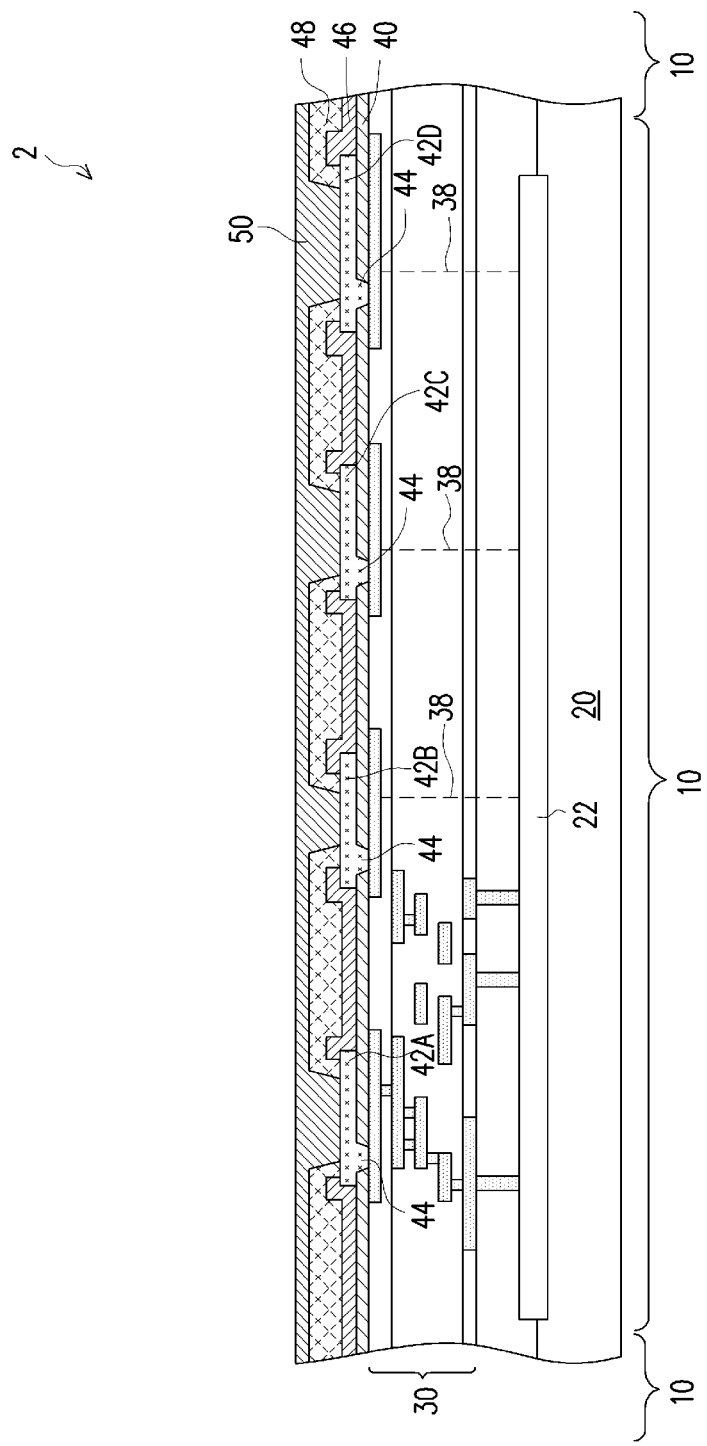

Next, as shown in FIG. 2, metal layer 50 is formed to fill the openings in polymer layer 48. Metal layer 50 is in contact with the top surfaces of metal pads 42. The respective step is shown as step 202 in the process flow illustrated in FIG. 33. In accordance with some embodiments of the present disclosure, the formation of metal layer 50 includes depositing a seed layer (not shown), and then plating a metal layer over the seed layer. The seed layer may include a titanium layer and a copper layer (both may be conformal layers) over the titanium layer. The seed layer may be deposited using Physical Vapor Deposition (PVD). The plated conductive material over the seed layer may include a copper layer, a gold layer, or may a copper layer and a gold layer over the copper layer. The plating may be performed using, for example, Electro-Chemical Plating (ECP) or Electro-less (E-less) plating. The plated metal layer 50 may be a blanket layer covering the entire wafer 2. After the plating, a planarization such as CMP or mechanical grinding step is performed to form a planar top surface for metal layer 50. In accordance with some embodiments in which metal layer 50 includes a copper layer and a gold layer, the planarization may be performed first to generate a planar surface that is higher than the top surface of polymer layer 48. After the CMP, the gold layer is formed, and hence will be a planar layer.

Figure 3:
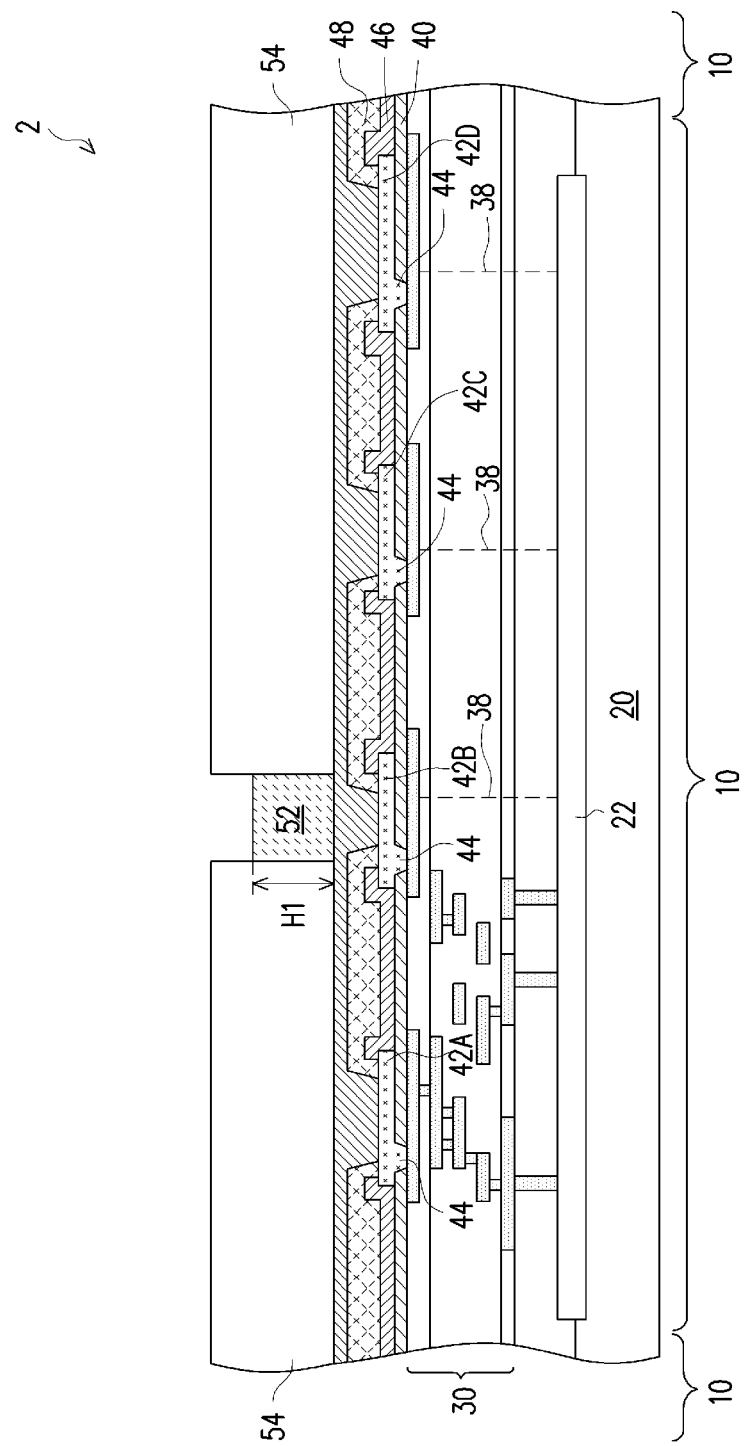

Referring to FIG. 3, raised via 52, which is alternatively referred to as a metal post, is formed. The respective step is shown as step 204 in the process flow illustrated in FIG. 33. In accordance with some embodiments of the present disclosure, mask layer 54, which may be a photo resist, is formed and patterned, exposing a portion of metal layer 50. Raised via 52 is then formed, for example, through ECP or E-less plating. Height H1 of raised via 52 may be greater than about 5 μm, and may be in the range between about 5 μm and about 50 μm. Raised via 52 may be formed of copper, aluminum, titanium, titanium nitride, nickel, gold, multi-layers thereof, and/or alloys thereof. In accordance with some embodiments of the present disclosure, raised via 52 is formed of a same material as the underlying contacting portion of metal layer 50, and there may, or may not, be a distinguishable interface therebetween. In accordance with alternative embodiments, raised via 52 and metal layer 50 are formed of different materials. Raised via 52 and metal layer 50 may also include same types of elements such as aluminum and/or copper, but have different percentages. After the formation of raised via 52, mask layer 54 is removed.

Figure 4:
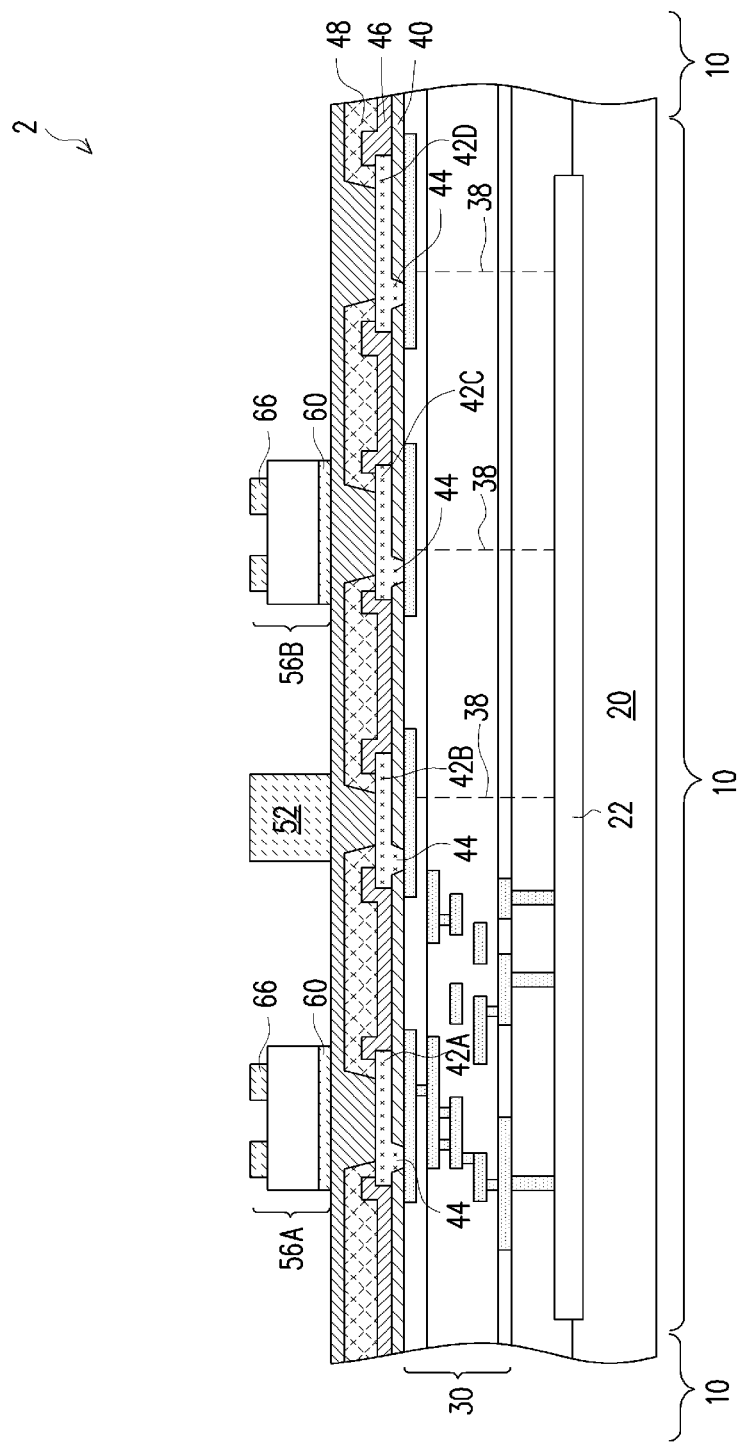

FIG. 4 illustrates the bonding of component devices 56A and 56B (collectively referred to component devices 56) to metal layer 50. The respective step is shown as step 206 in the process flow illustrated in FIG. 33. Component devices 56 are sometimes referred to as Surface Mount Devices (SMDs) since they are formed close to the top surfaces of chips 10. Component devices 56 are also sometimes referred to as Integrated Passive Devices (IPDs), which include passive devices therein. In accordance with some exemplary embodiments, component devices 56 include capacitors, inductors, resistors, diodes (such as photo diodes) therein. Furthermore, one or more of component devices 56 may be single-device components, each including a capacitor, an inductor, a diode, or the like, and does not include other active devices (such as transistors) or passive devices.

Figure 32A:
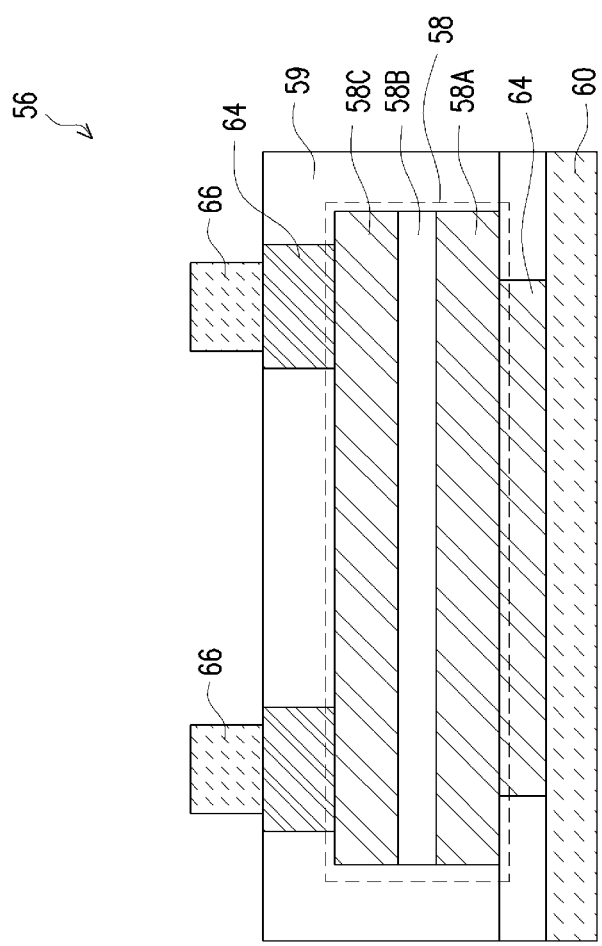
FIGS. 32A and 32B illustrate a cross-sectional view and a top view of a component device in accordance with some embodiments.

Each of component devices 56 includes two terminals (such as 60 and 66) at different planes, which include a plane of the top surface and a plane of the bottom surface of the respective component device 56. The two terminals 60 and 66 are connected to the two capacitor electrodes when the respective component device 56 is a capacitor. The two terminals are connected to the two ends of a coil when the respective component device 56 is an inductor. The two terminals are connected to the anode and the cathode when the respective component device 56 is a diode. FIG. 32A illustrates a cross-sectional view of an exemplary component device 56 including capacitor 58 therein, which includes bottom electrode 58A, capacitor insulator 58B, and top electrode 58C. Bond layer 60 is electrically connected to bottom capacitor electrode 58A through conductive layer 62 in accordance with some embodiments, and acts as a bottom terminal of the component device. Top terminal 66 is electrically connected to top capacitor electrode 58C, for example, through conductive layer 64. Capacitor 58 (or other types of devices) may be formed in dielectric layers 59.

Figure 32B:
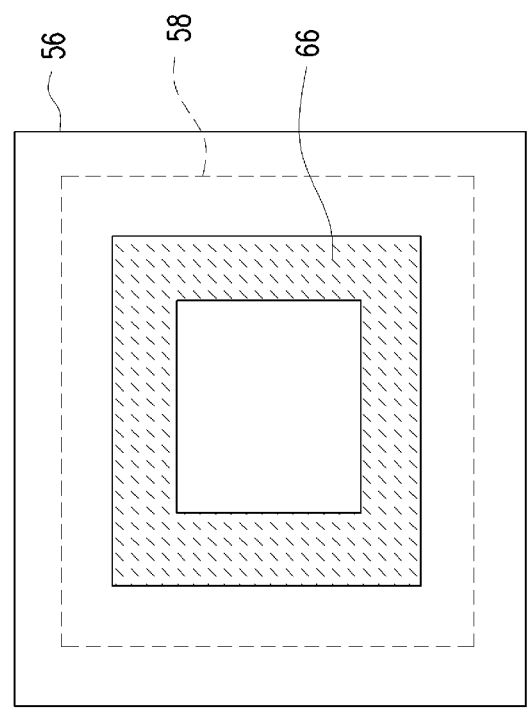

FIG. 32B illustrates a top view of component device 56 in accordance with some embodiments of the present disclosure. Top terminal 66 may be formed as a ring in accordance with some embodiments, or formed as a solid metal pad. For example, if component device 56 includes a photo diode or a light-emitting diode, the region surrounded by the ring-shaped top terminal 66 may be used to allow light to be received by component device 56, or used to allowing light to be emitted out of component device 56. Accordingly, although FIG. 4 shows that there are two top terminals 66, the two illustrate top terminals 66 may be the parts of the same ring-shaped top terminal. In accordance with alternative embodiments, component device 56 may include two or more top terminals 66 that are not electrically shorted.

In accordance with some embodiments, depending on the material and the structure of bottom terminals 60, which act as the bond layers, the bonding may be direct metal-to-metal bonding such as copper-to-copper bonding or gold-to-gold bonding, solder bonding, or the like. Accordingly, one bond layer 60 may include a metal layer directly joined to metal layer 50. When bond layer 60 does not include solder, the non-solder metal layer in bond layer 60 is directly bonded to metal layer 50. When bond layer 60 includes a solder layer, the solder layer is between, and contacts, both the non-solder metal layer in bond layer 60 and metal layer 50.

Figure 5:
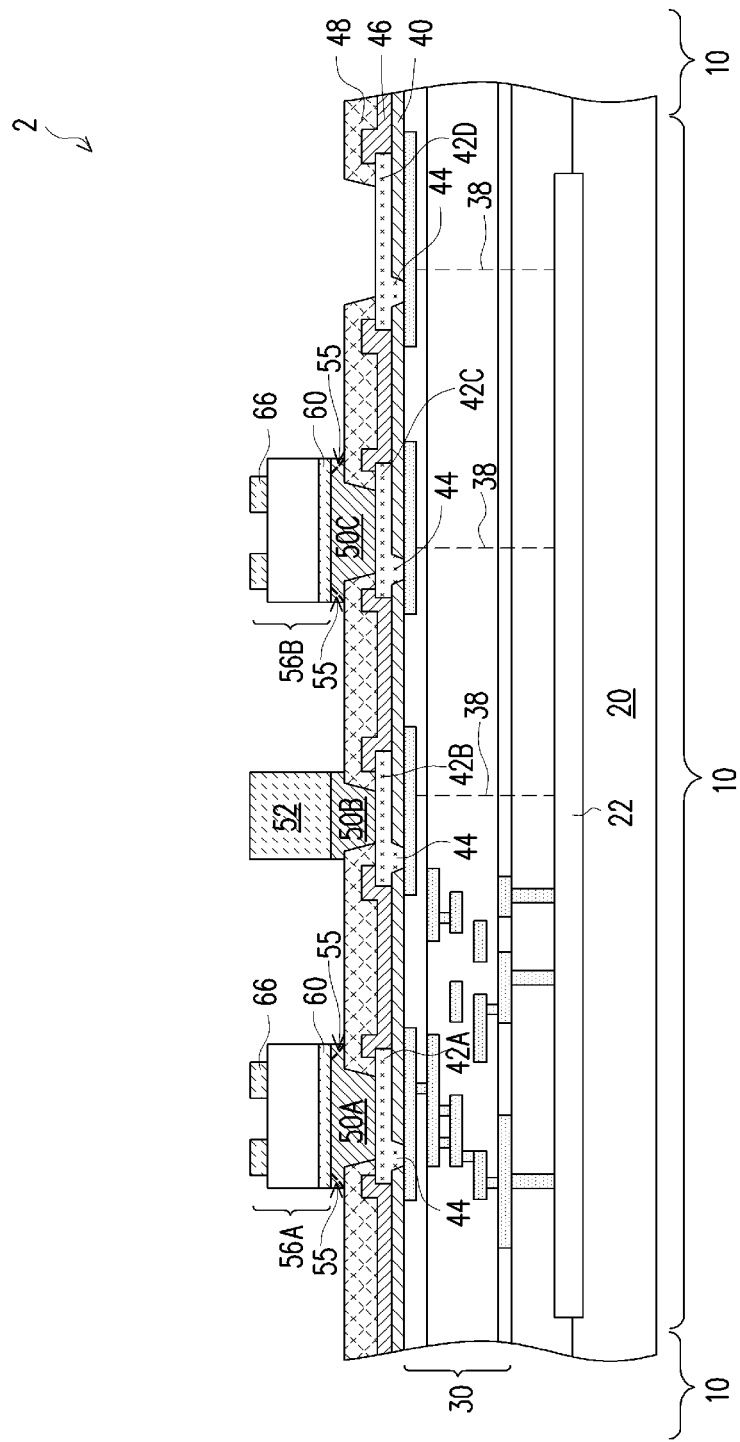

Next, referring to FIG. 5, an etching step is performed to remove the portions of metal layer 50 not covered by component devices 56 and raised via 52. The respective step is shown as step 208 in the process flow illustrated in FIG. 33. In accordance with some embodiments of the present disclosure, the etching includes wet etch or dry etch. As a result of the etch, bond pads 50A and 50C, which are the remaining portions of metal layer 50, are formed, and are connected to the overlying bottom terminals 60. Bond pad 50B is left underlying raised via 52. As a result of the etch, undercuts may be formed, wherein bond pads 50A, 50B, and 50C are laterally recessed from the respective edges of the overlying devices/features 56 and 52. For example, dashed lines 55 schematically illustrate the shapes of the edges of conductive layers 52A and 52C when the undercuts occurs. Depending on the materials of bottom terminals 60, terminals 60 may or may not have undercuts relative to the edges of the overlying dielectric layers in the respective component device 56. In addition, if the material of raised via 52 is different from that of bond pad 50B, similar undercuts may also be formed in bond pad 50B. As a result of the etching of metal layer 50, the portions of metal layer 50 covering metal pad 42D are also removed, and metal pad 42D is also revealed.

Figure 6:
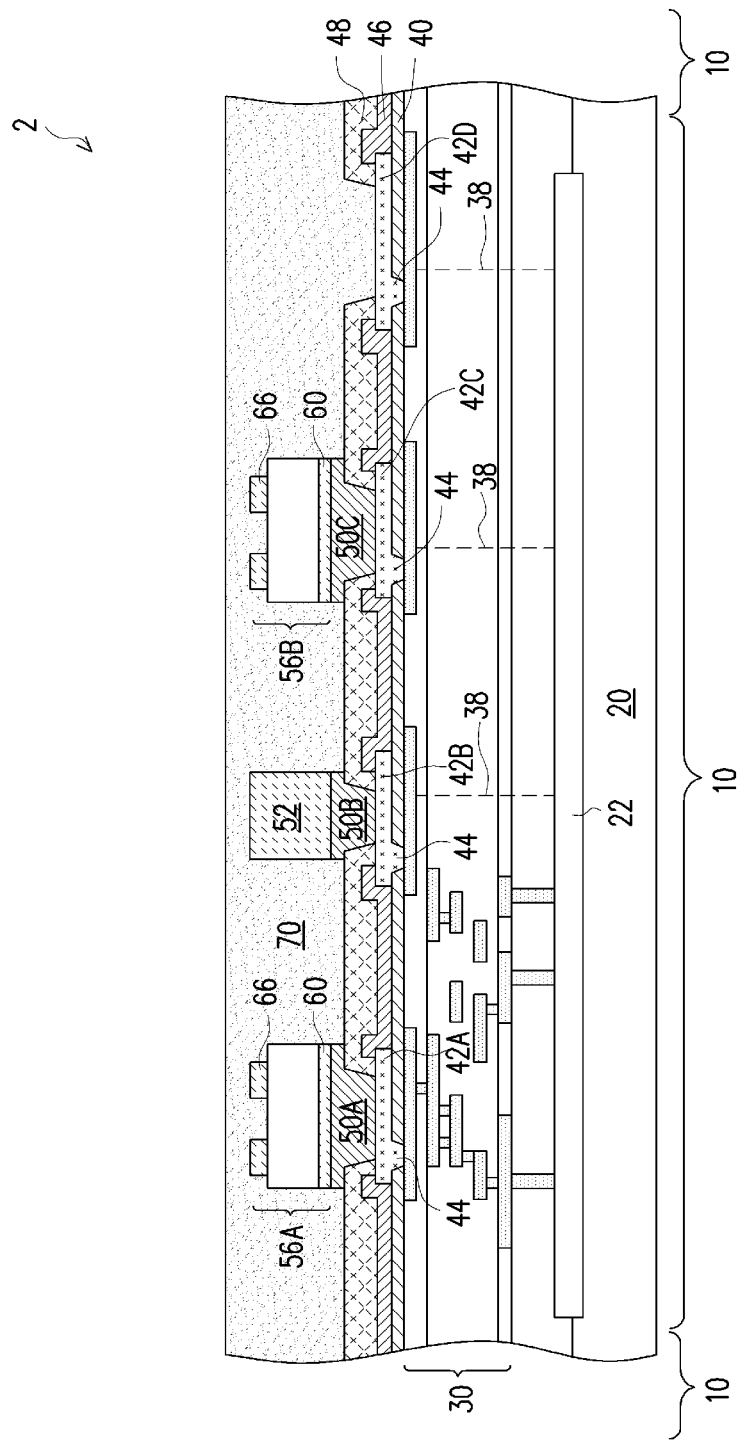
Figure 7:
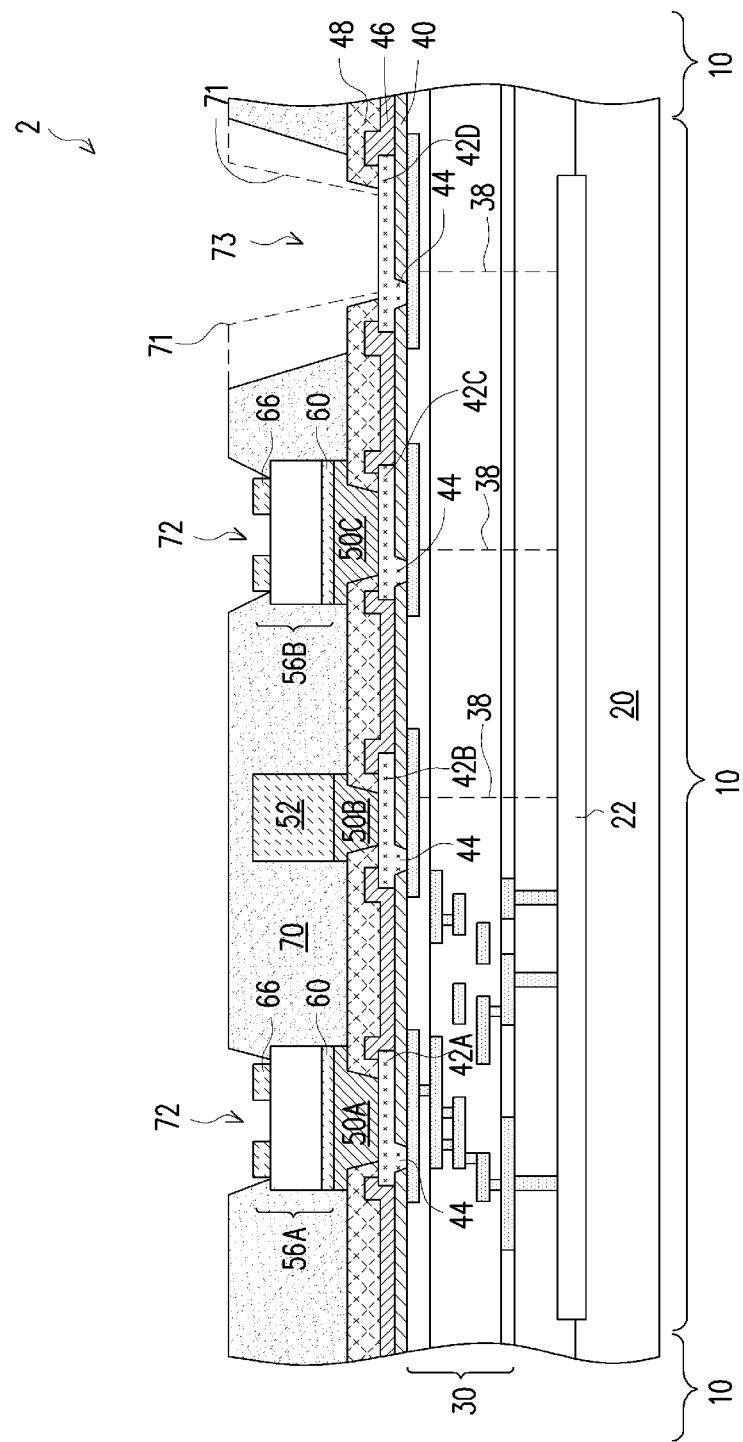

FIG. 6 illustrates the coating of devices with dielectric layer 70, which may be formed of a polymer such as polyimide, PBO, or BCB. A light planarization may be performed to planarize the top surface of dielectric layer 70. The top surface of dielectric layer 70 is higher than the top surfaces of component devices 56 and raised via 52, and hence component devices 56 and raised via 52 are encapsulated in dielectric layer 70. The respective step is shown as step 210 in the process flow illustrated in FIG. 33. Next, as shown in FIG. 7, dielectric layer 70 is patterned to form openings 72, through which top terminals 66 are revealed. The respective step is shown as step 212 in the process flow illustrated in FIG. 33. The patterning may be performed through etching in a photolithography process. In the same process for forming openings 72, opening 73 is also formed to reveal metal pad 42D again. In accordance with alternative embodiments in which dielectric layers 48 and 70 have similar etching properties, the opening 73 may have the shape as shown by dashed lines 71.

Figure 8:
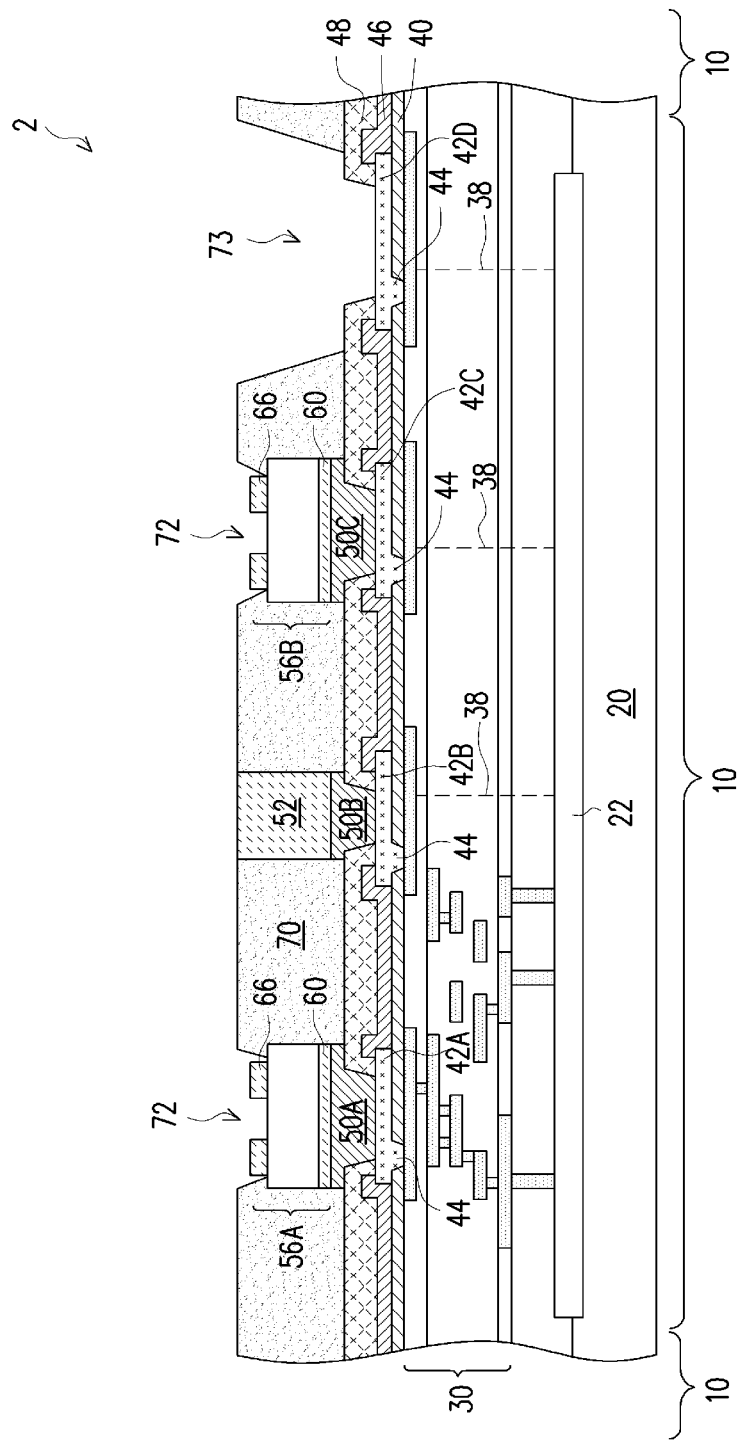

Next, as shown in FIG. 8, raised via 52 is revealed. The respective step is also shown as step 212 in the process flow illustrated in FIG. 33. The exemplary process may include a blanket etching back of dielectric layer 70, a CMP on dielectric layer 70, or a mechanical grinding on dielectric layer 70. If the etching back is adopted, the top surface of raised via 52 may be higher than the top surface of the etched dielectric layer 70 when the etching back is finished. The top surface of raised via 52 may also be level with the top surface of dielectric layer 70 when the CMP or mechanical grinding is performed.

Figure 9:
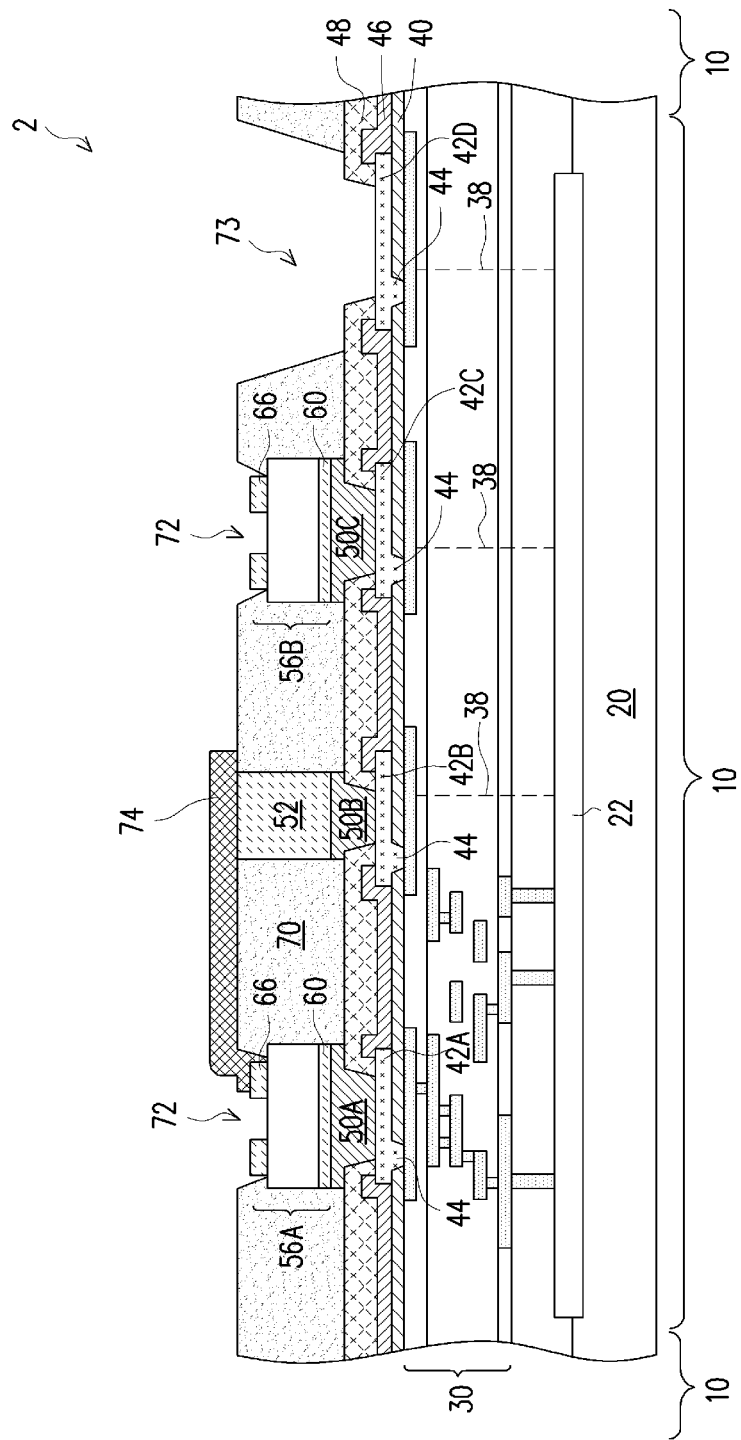

FIG. 9 illustrates the formation of redistribution line 74. The respective step is shown as step 214 in the process flow illustrated in FIG. 33. An exemplary formation process includes depositing a seed layer, forming a patterned mask layer (not shown) such as photo resist over the seed layer, plating (for example, using ECP) the redistribution line 74, removing the patterned mask layer, and removing the portions of the seed layer not covered by the redistribution lines. Redistribution line 74 contacts the top surface of raised via 52, and electrically connects top terminal 66 of component device 56A to metal pad 42B. In accordance with alternative embodiments, redistribution line 74 is formed by blanket depositing a metal layer, and then patterning the metal layer through etching. Redistribution line 74 may be formed of copper, aluminum, nickel, palladium, or alloys thereof.

It is noted that although not shown, there may be a redistribution line connected to the top terminal 66 of component device 56B. However, since the redistribution line is formed in a plane other than what is illustrated, the redistribution line is not visible. Similarly, the top terminal 66 of component device 56B may also be connected to another raised via that is formed simultaneously as the illustrated raised via 52.

Figure 10:
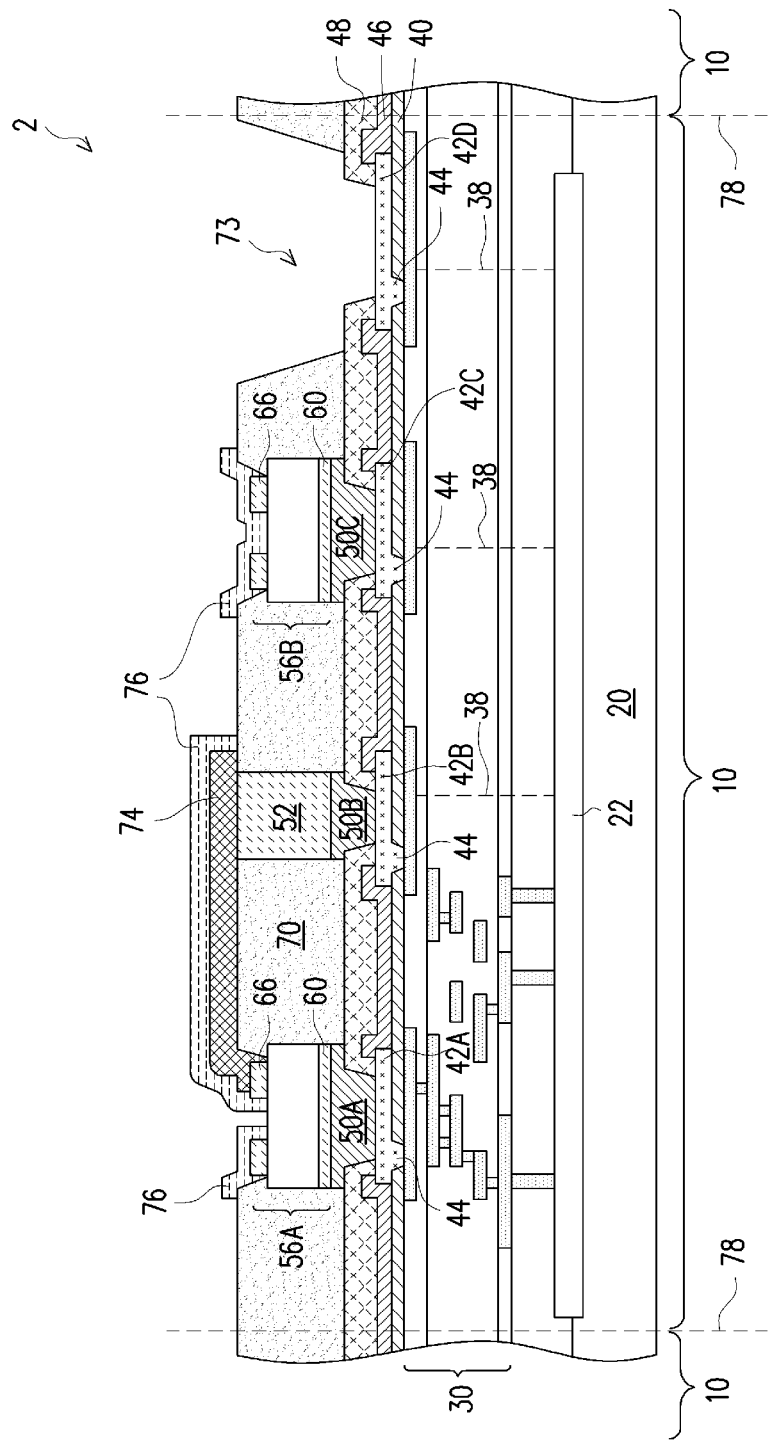

Next, as shown in FIG. 10, passivation layer 76 is formed to isolate redistribution line 74 and top terminal 66 from outside environment. The respective step is shown as step 216 in the process flow illustrated in FIG. 33. In accordance with some embodiments of the present disclosure, passivation layer 76 is formed of a polymer such as polyimide or PBO, or an inorganic material such as silicon oxide, silicon nitride, or multi-layers thereof. In a subsequent step, wafer 2 is singulated along scribe lines 78 to separate chips 10 from each other, wherein chips 10 have the identical structures. The respective step is shown as step 218 in the process flow illustrated in FIG. 33.

Figure 11:
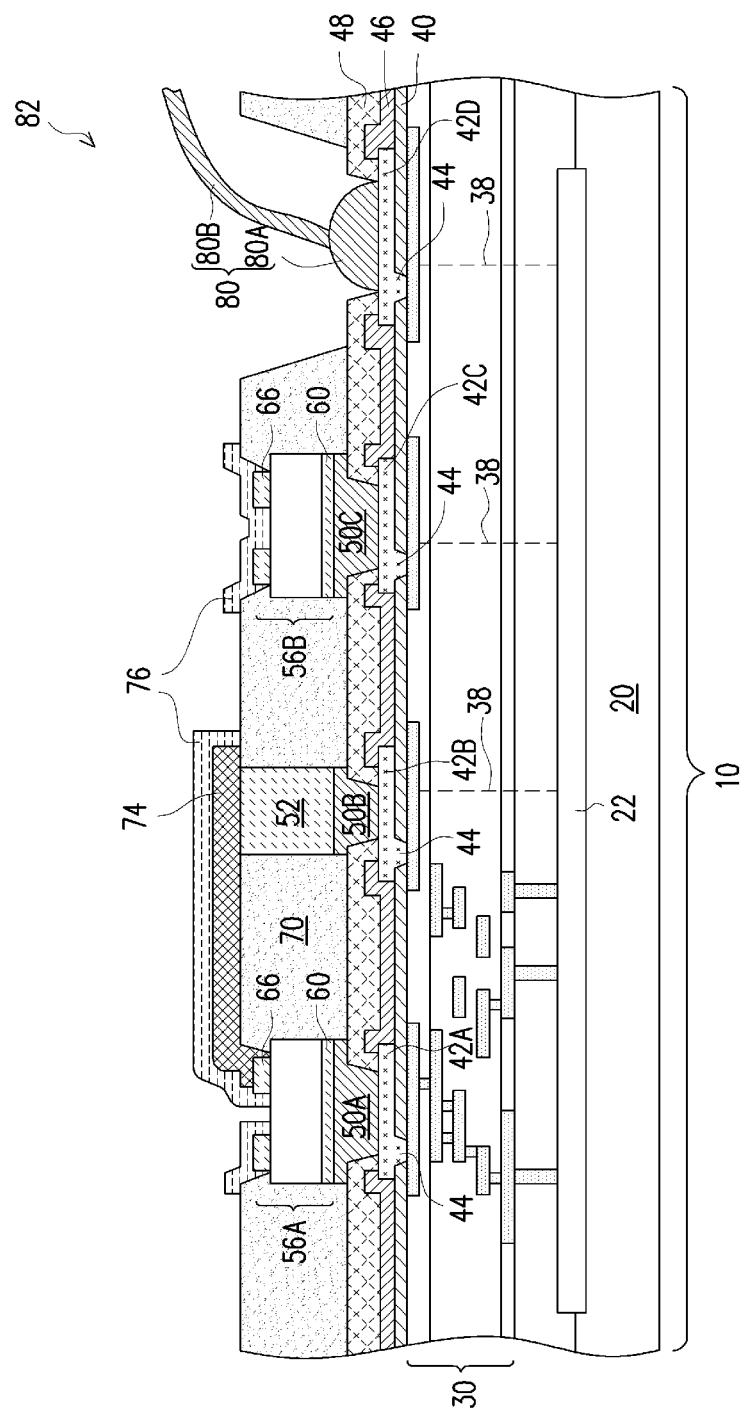

FIG. 11 illustrates the bonding of chip 10, for example, through wire bonding, so that package 82 is formed. The respective step is shown as step 220 in the process flow illustrated in FIG. 33. In accordance with some embodiments, the back surface of chip 10 is adhered to another package component (not shown) such as a package substrate, a printed circuit board, or a lead frame through an adhesive film (not show). Chip 10 is then bonded to the package component, wherein wire bond structure 80, which includes bond ball 80A and metal wire 80B attached to bond ball 80A, is formed to electrically connect metal pad 42D to the package component. Chip 10 along with the wire bond structure 80 may then be encapsulated, for example, in an encapsulating material such as a molding compound (not shown).

FIGS. 12 through 31 illustrate cross-sectional views of intermediate stages in the formation of packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 11. The details regarding the formation process and the materials of the components shown in FIGS. 12 through 31 may thus be found in the discussion of the embodiment shown in FIGS. 1 through 11.

Figure 12:
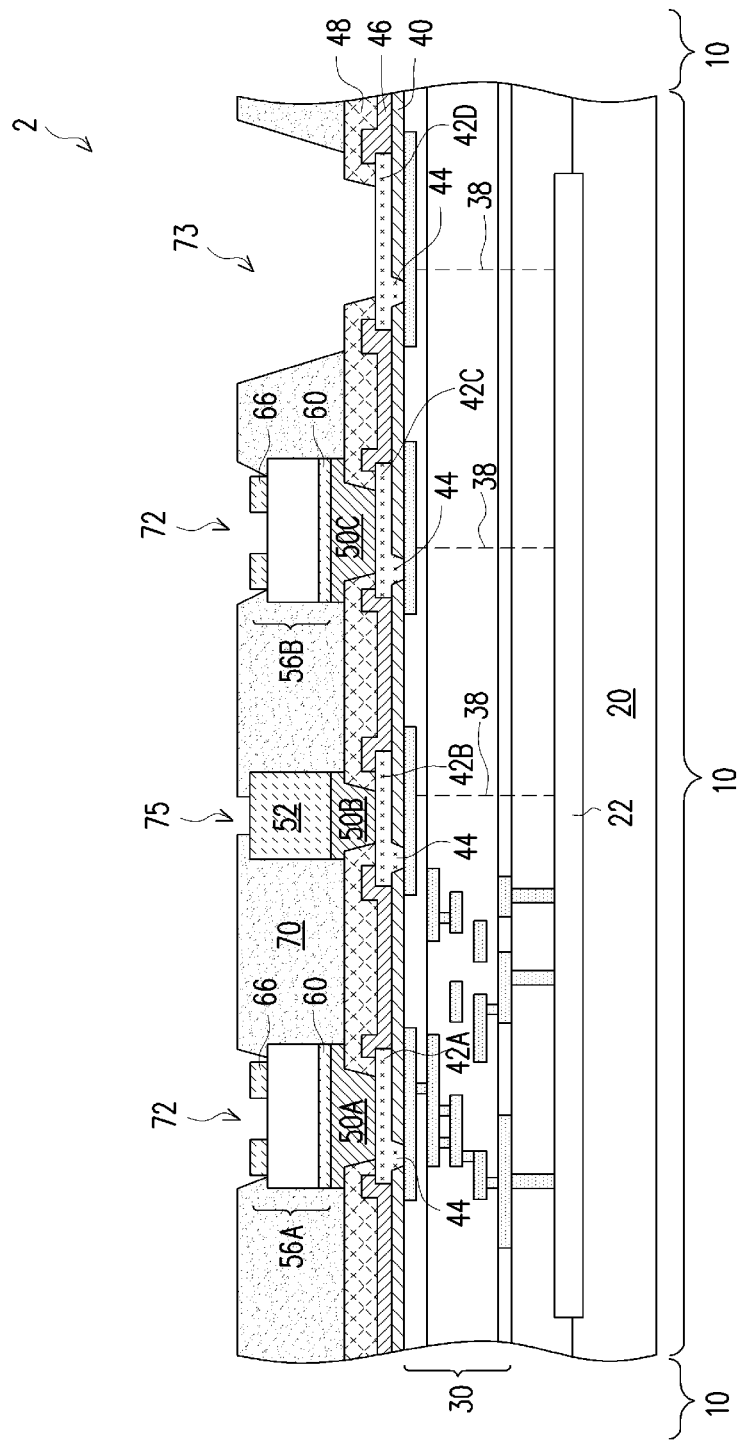
FIGS. 12 and 13 illustrate the cross-sectional views of intermediate stages in the formation of a package integrated with a component device in accordance with some embodiments.
Figure 13:
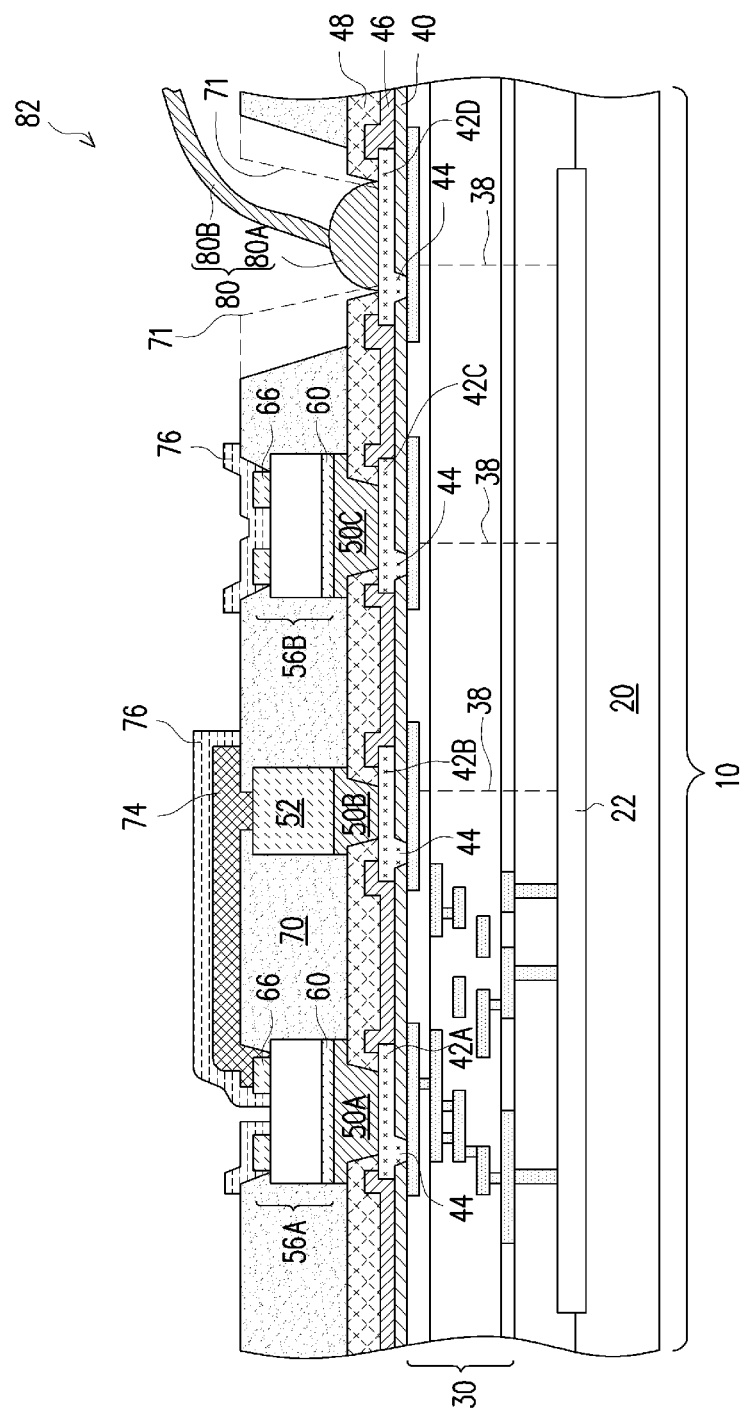
Figure 14:
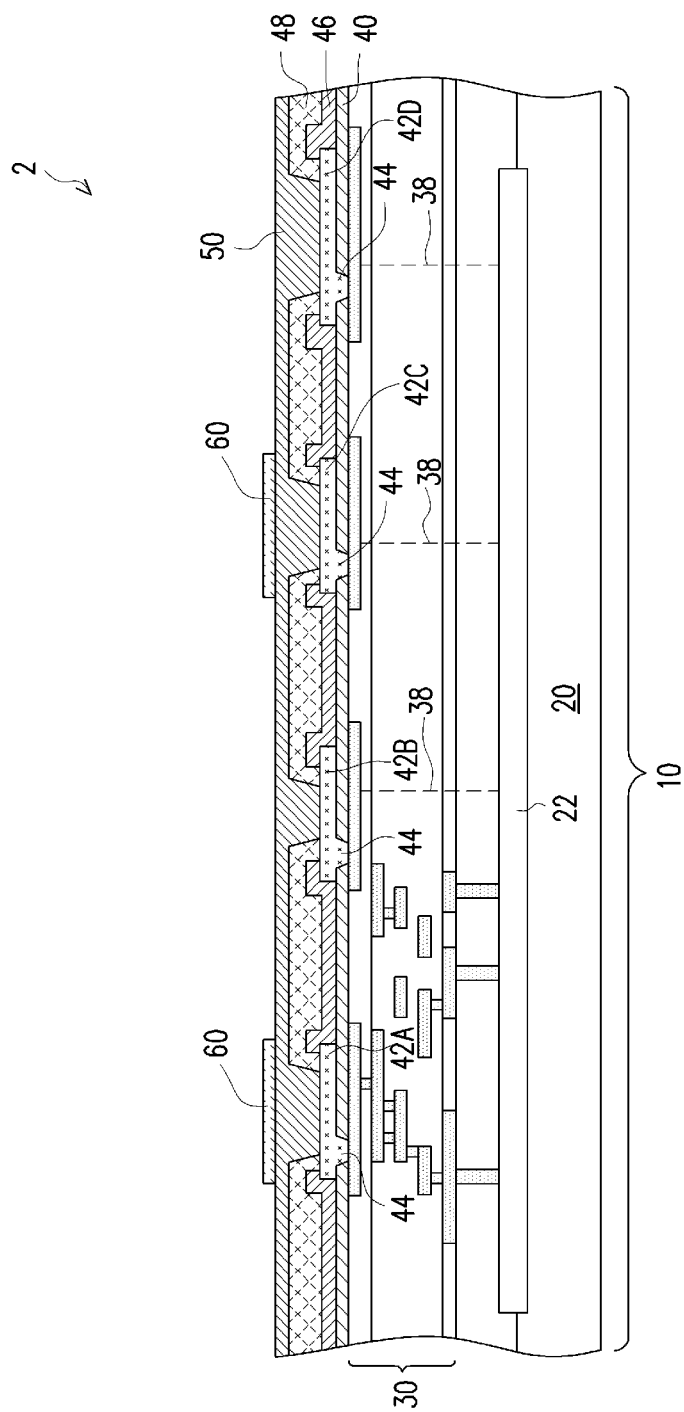
FIGS. 14 through 18 illustrate the cross-sectional views of intermediate stages in the formation of a device die and a component device at a top portion of the device die in accordance with some embodiments.

FIGS. 12 and 13 illustrate the intermediate stages in the formation of a package in accordance with alternative embodiments. These embodiments are similar to the embodiments shown in FIGS. 1 through 11 except that the steps shown in FIGS. 7 and 8 are replaced by a single etching step to reveal both top terminals 66 and raised via 52 at the same time, as shown in FIG. 12. In the etching of dielectric layer 70, opening 75 is formed simultaneously as openings 72 and 73. Opening 75 extends into dielectric layer 70 and reveals the top surface of raised via 52. FIG. 13 illustrates the resulting package 82 in accordance with these embodiments, wherein redistribution line 74 extends into the opening 75 (FIG. 12) to contact raised via 52.

FIGS. 14 through 18 illustrate the intermediate stages in the formation of a package in accordance with alternative embodiments. These embodiments are similar to the embodiments shown in FIGS. 1 through 11 except that instead of bonding pre-formed component devices 56, component devices 56 are in-situ formed over wafer 2. The initial steps are similar to what are shown in FIGS. 1 and 2. After the wafer 2 as shown in FIG. 2 is formed, bottom terminals 60 are formed. The formation process may be similar to the process for forming redistribution lines 74, and hence is not repeated.

Figure 15:
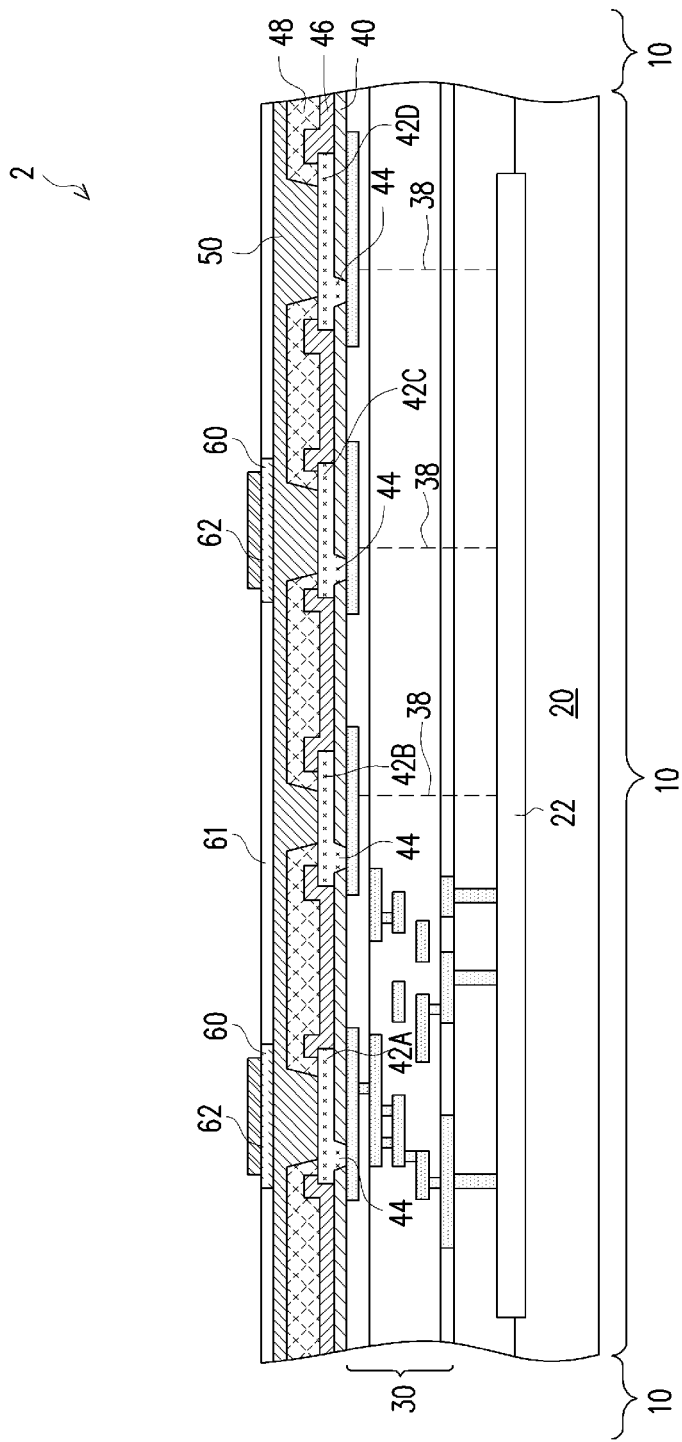
Figure 16:
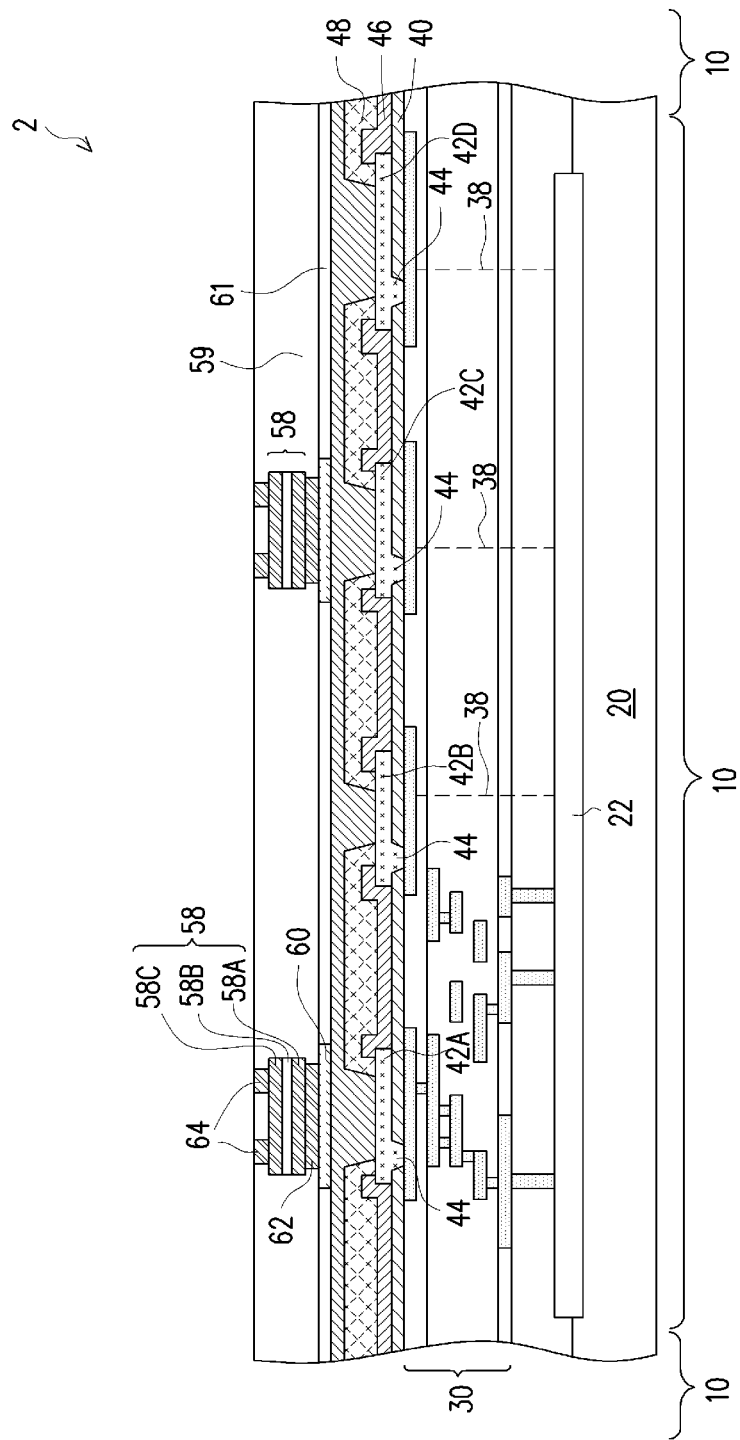

Referring to FIG. 15, bottom terminals 60 is formed in layer 61, which may be a dielectric layer or a semiconductor layer (such as a polysilicon layer or crystalline silicon layer). When layer 61 is a semiconductor layer, dielectric layers (not shown) are formed as rings to encircle bottom terminals 60 in order to electrically insulate bottom terminals 60 from the semiconductor substrate. Next, conductive layers 62, which may be formed of copper, aluminum, or the like, are formed and patterned. In subsequent processes, as shown in FIG. 16, the devices such as passive devices or diodes are formed. In accordance with some embodiments, capacitors 58 are formed, which are embedded in dielectric layers 59 extending throughout wafer 2.

Figure 17:
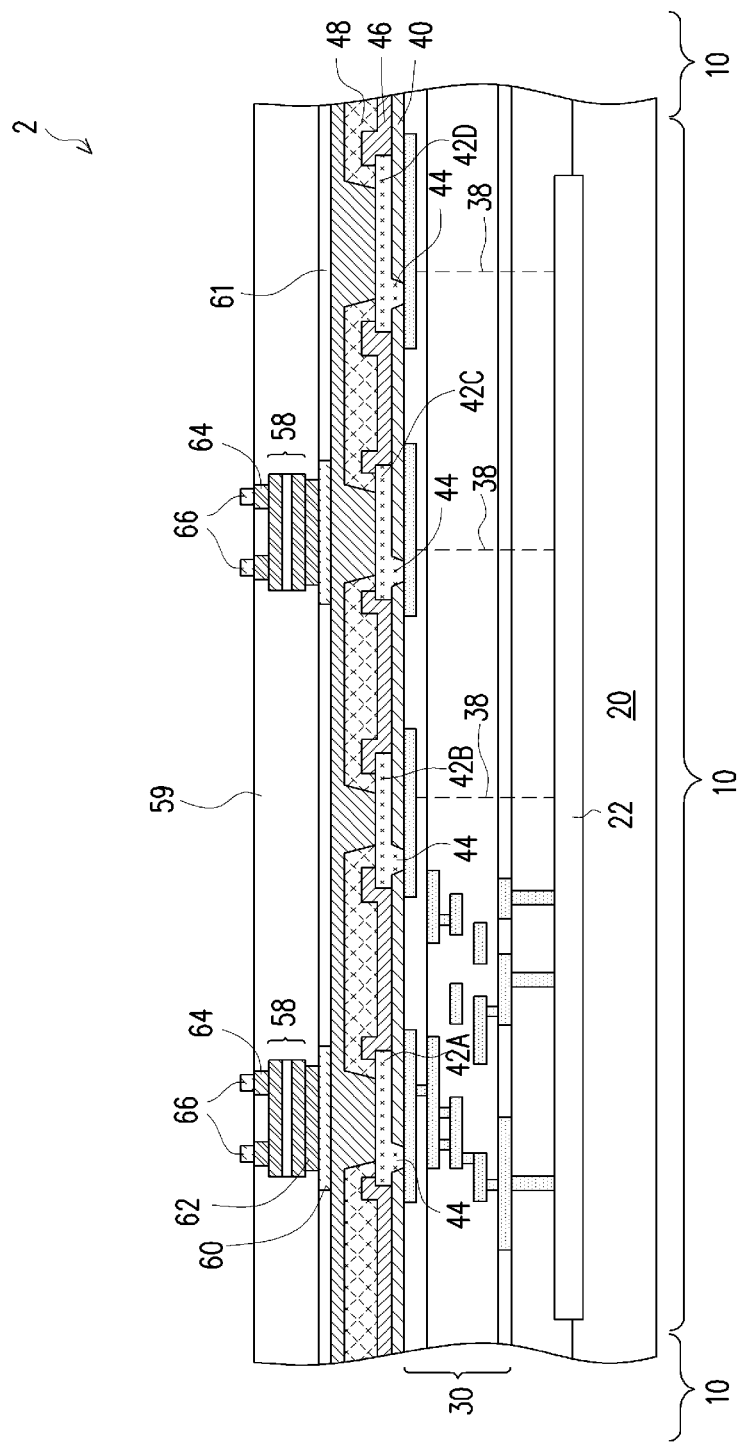

FIG. 17 illustrates the formation of top terminals 66, which again may be formed using a process similar to the formation of redistribution lines 74. It is appreciated that the structures of component device 56 may be different from what are illustrated. For example, layers 60, 62, and 64 may be omitted, while bond pads 50A and 50C may act as the bottom capacitor electrodes, while capacitor insulators 58B may be formed directly over and contacting bond pads 50A and 50C, so that the structure of component devices 56 is simplified. In the subsequent step, layers 61 and 59, which extend on the entire wafer 2, are etched in a photolithography process, so that component devices 56 are separated from each other. The resulting wafer 2 is shown in FIG. 18.

Figure 18:
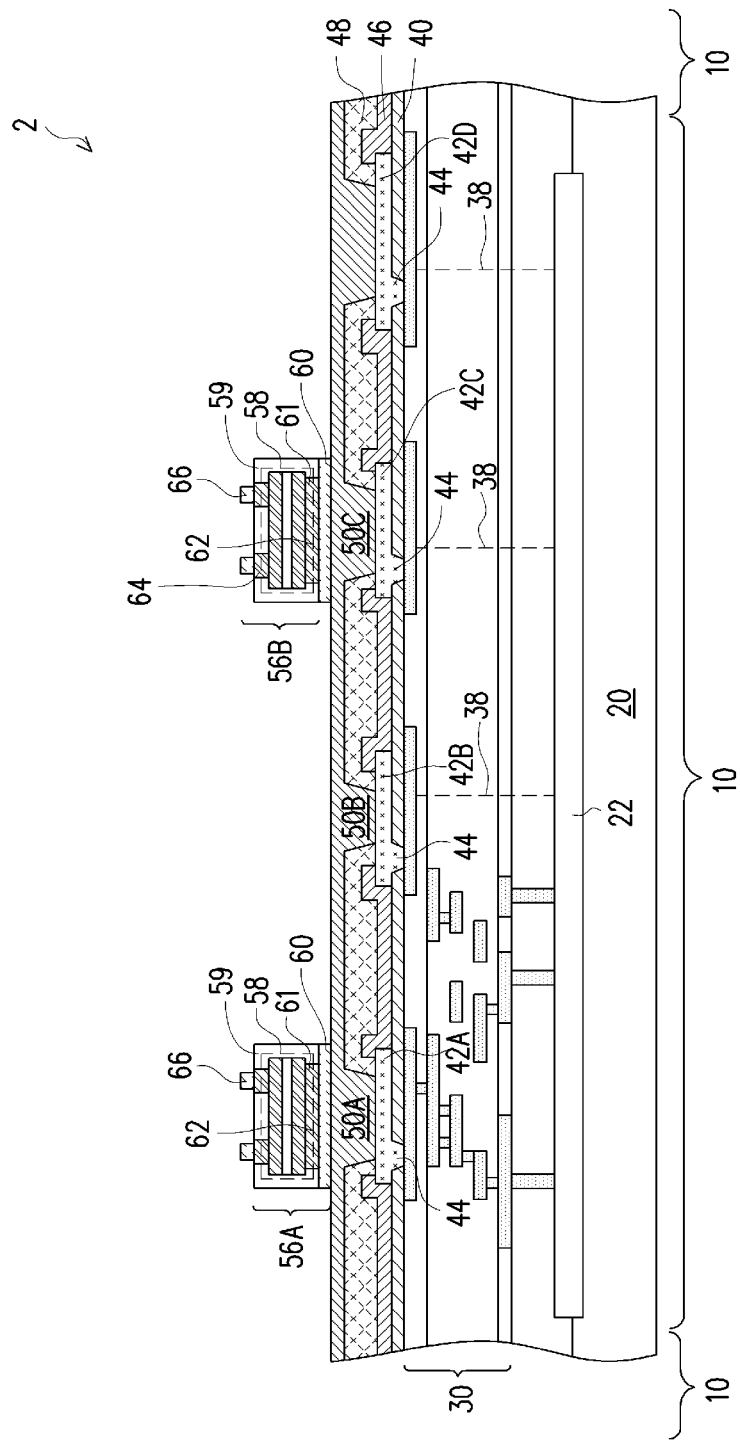

In a subsequent step, raised via 52 is formed on the structure shown in FIG. 18, and the resulting structure will be similar to what is shown in FIG. 4. The steps shown in FIGS. 5 through 11 may then be performed to finish the formation of the package.

Figure 19:
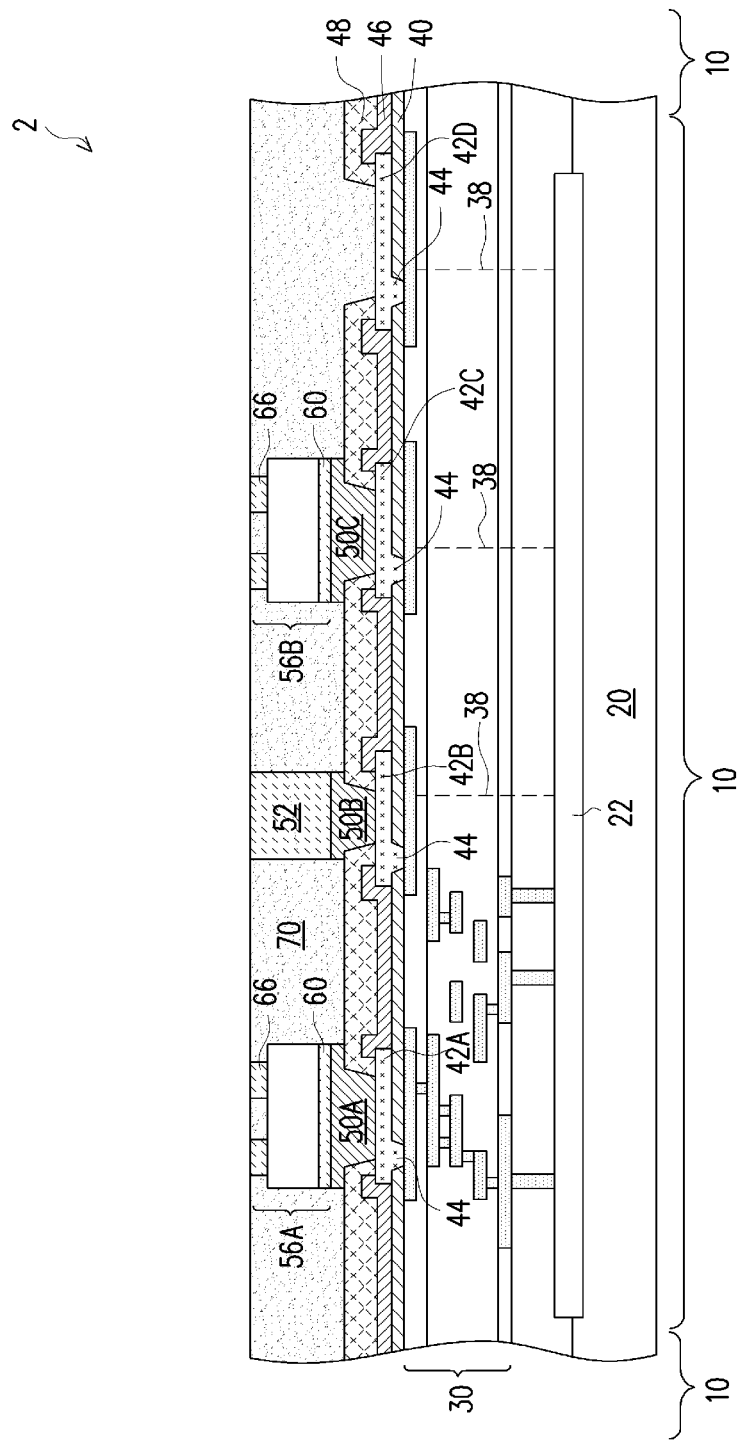
FIGS. 19 through 21 illustrate the cross-sectional views of intermediate stages in the formation of a package integrated with a component device in accordance with some embodiments.
Figure 20:
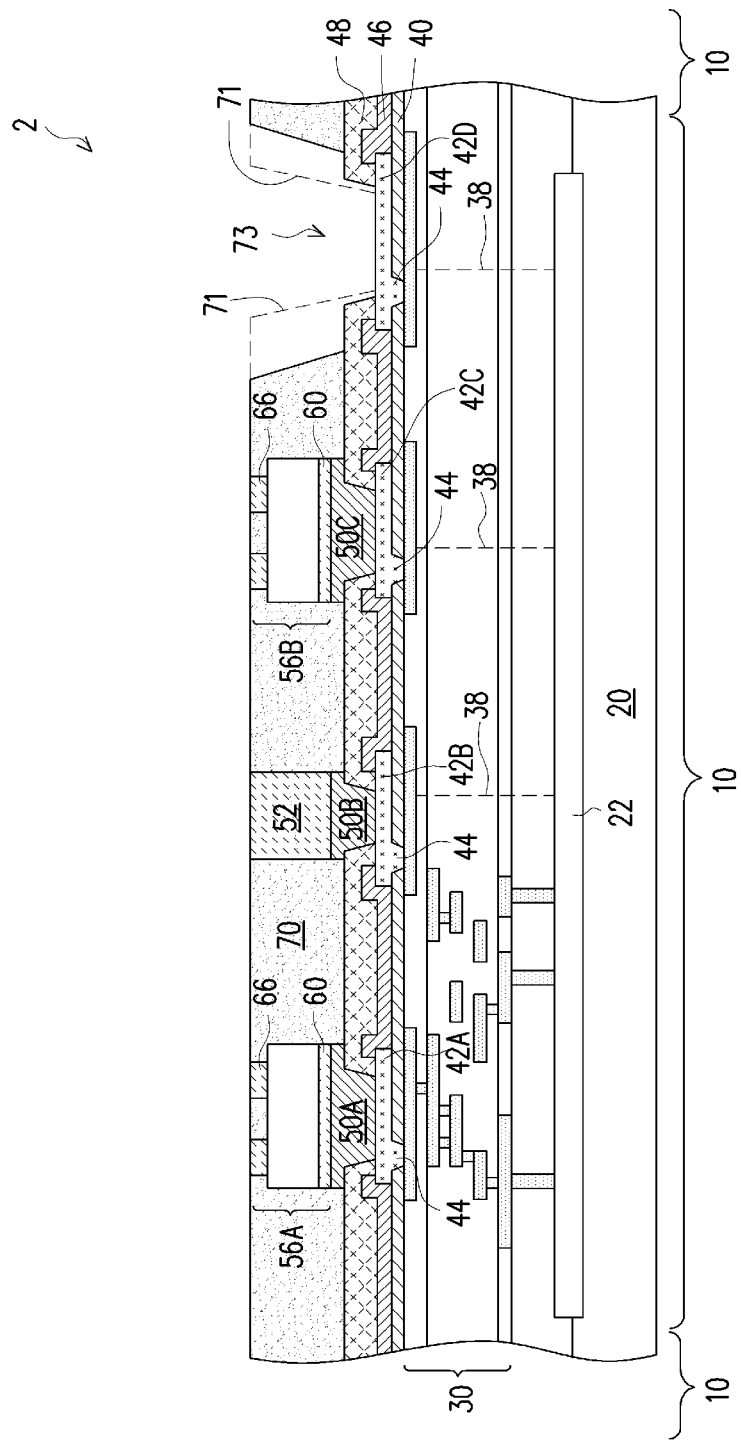
Figure 21:
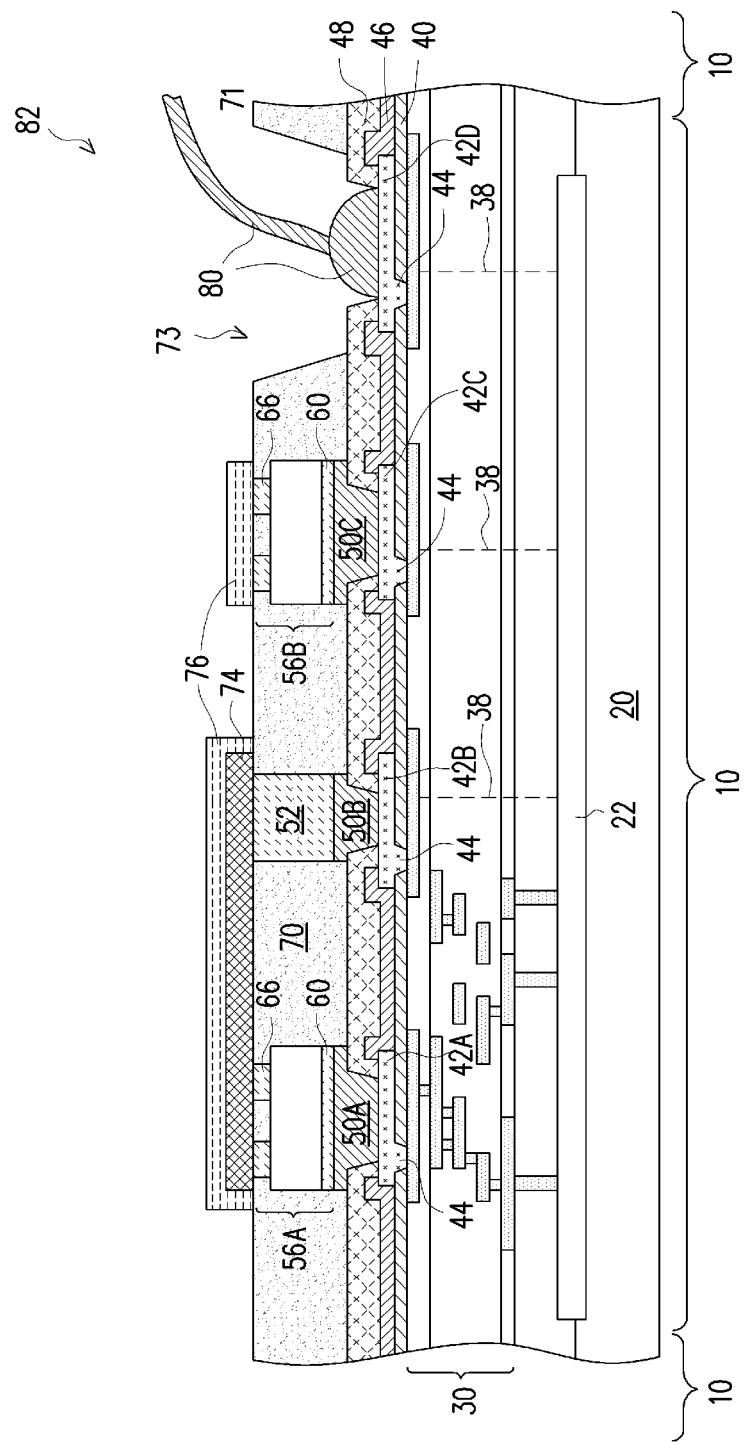

FIGS. 19 through 21 illustrate the intermediate stages in the formation of a package in accordance with alternative embodiments. These embodiments are similar to the embodiments shown in FIGS. 1 through 11, except that the steps shown in FIGS. 7 and 8 are replaced with the steps shown in FIGS. 19 and 20. The initial steps are similar to what are shown in FIGS. 1 through 6. After the wafer 2 as shown in FIG. 6 is formed, a CMP or a mechanical grinding is performed to thin dielectric layer 70, until both top terminals 66 and raised via 52 are revealed, as shown in FIG.

19. Accordingly, the top surfaces of terminals 66, raised via 52, and dielectric layer 70 are substantially coplanar. Next, as shown in FIG. 20, opening 73 is formed in a lithography process to reveal metal pad 42D. In the step shown in FIG. 21, redistribution line 74 and passivation layer 76 are formed, and wire bond structure 80 is formed to form package 82.

Figure 22:
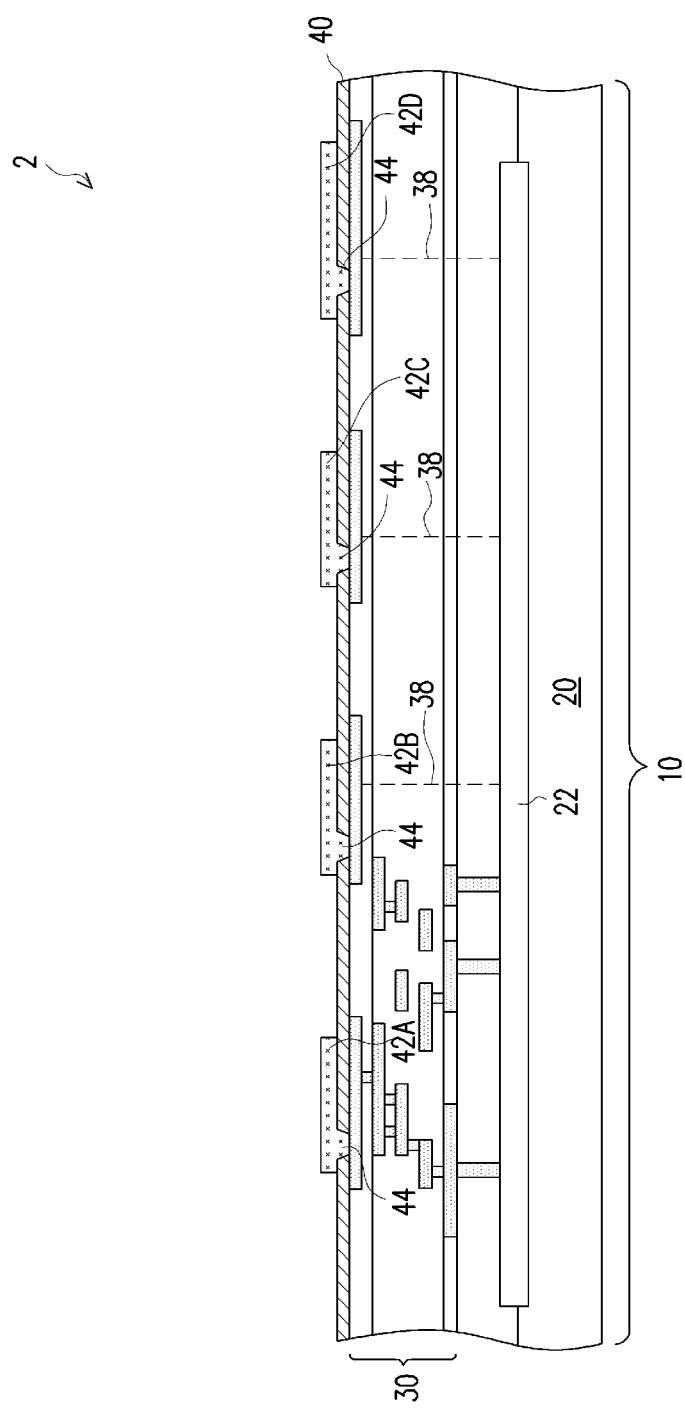
FIGS. 22 through 31 illustrate the cross-sectional views of intermediate stages in the formation of a package integrated with a component device formed on a separate chip in accordance with some embodiments.

FIGS. 22 through 31 illustrate the intermediate stages in the formation of a package in accordance with alternative embodiments. These embodiments are similar to the embodiments shown in FIGS. 1 through 11 except that the component devices are formed on another chip or wafer when bonded. Referring to FIG. 22, wafer 2 is provided. Wafer 2 as shown in FIG. 22 is similar to the wafer 2 shown in FIG. 1, except passivation layer 46 and dielectric layer 48 as shown in FIG. 1 are not formed.

Figure 23:
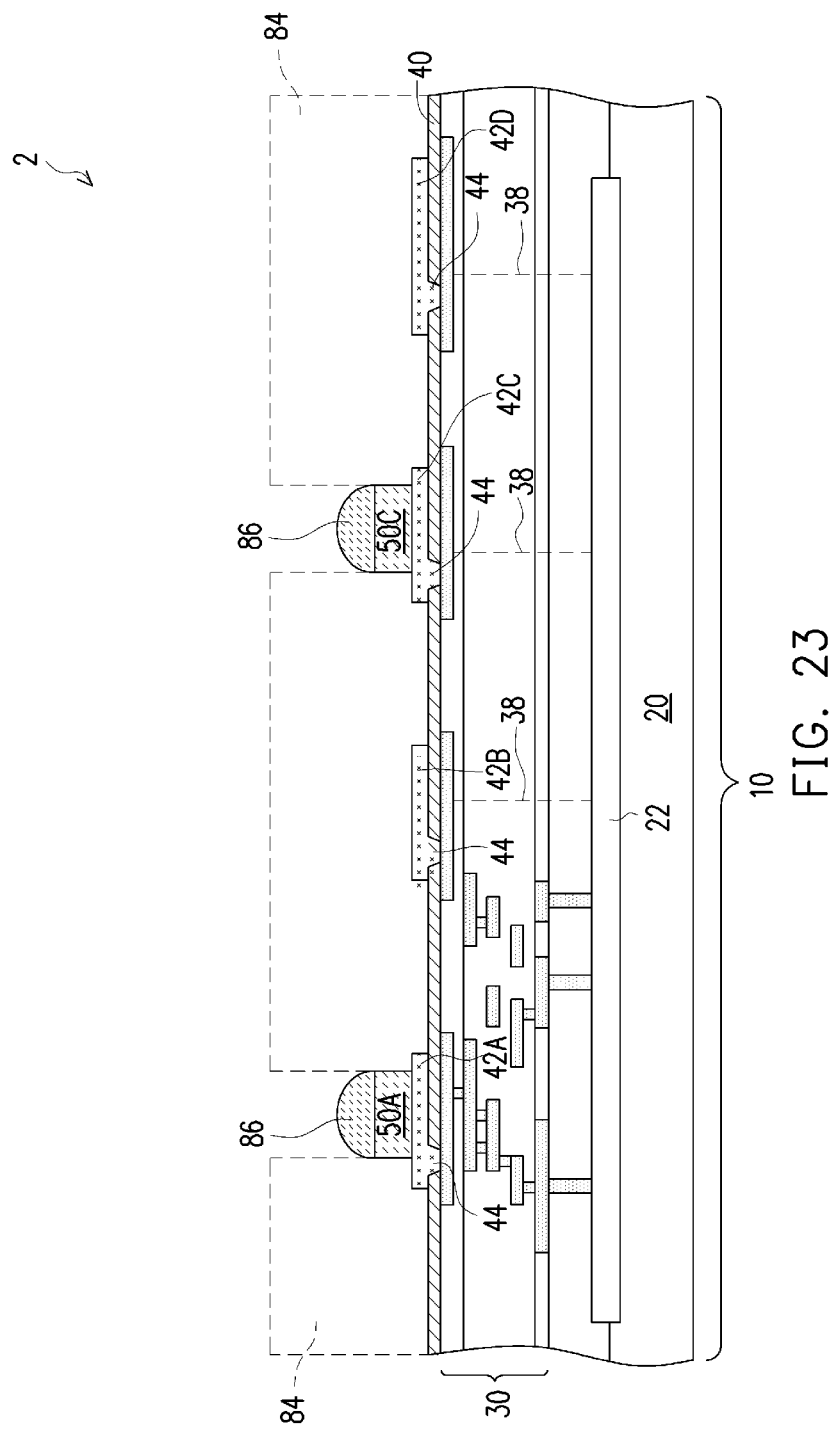

Next, referring to FIG. 23, bond pads 50A and 50C are formed. In accordance with some embodiments of the present disclosure, photo resist 84 is formed, and is then patterned to expose a portion of each of metal pads 42A and 42C. Metal pad 42B is covered by photo resist 84. Next, bond pads 50A and 50C are formed through plating, wherein bond pads 50A and 50C may be formed of similar materials and have similar structure as bond pads 50A and 50C shown in FIG. 5. In addition, solder region 86 may also be formed by plating on top of bond pads 50A and 50C. Photo resist 84 is then removed, followed by a reflow process to reflow solder regions 86.

Figure 24:
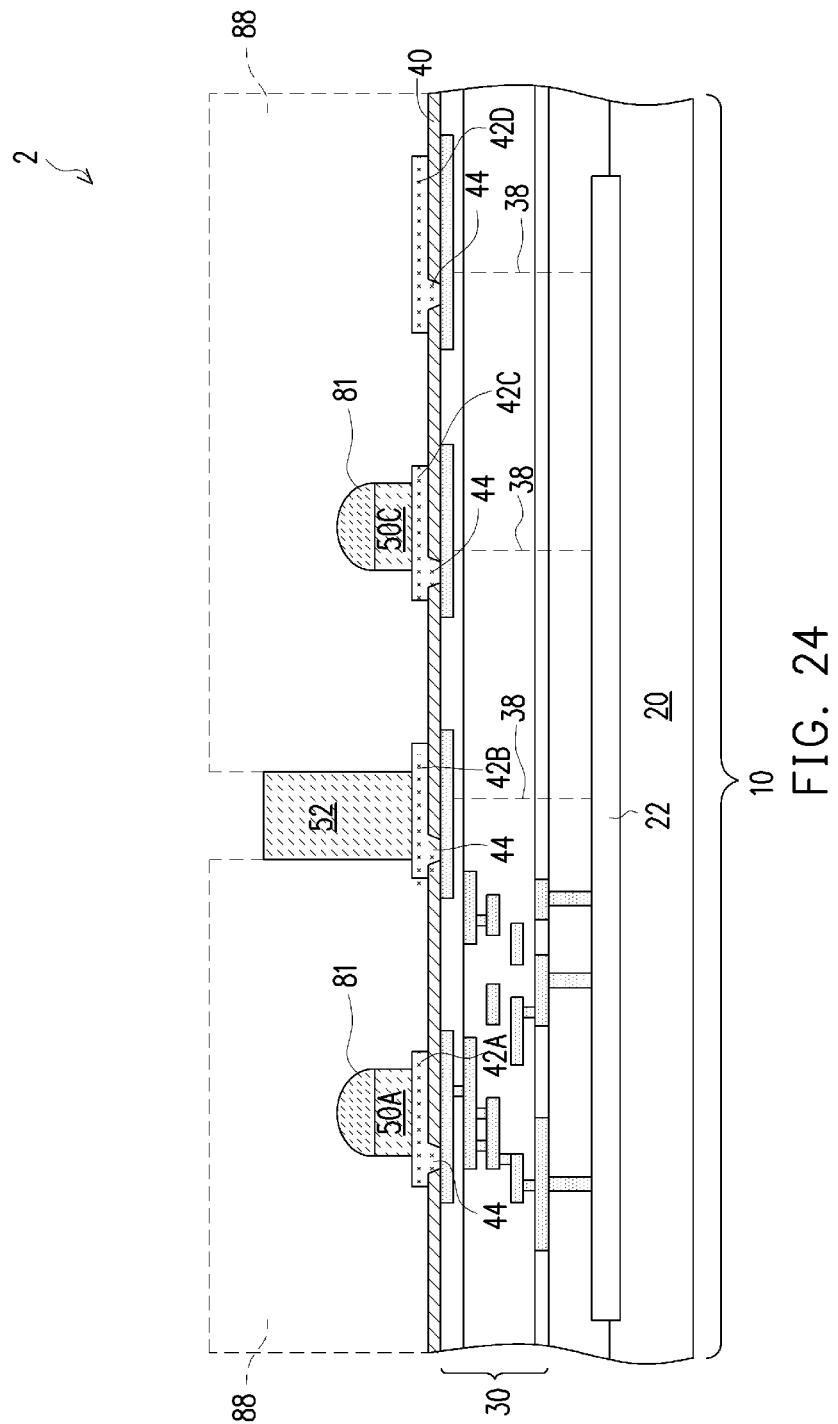

FIG. 24 illustrates the formation of raised via 52. In accordance with some embodiments of the present disclosure, photo resist 88 is formed, and is then patterned to expose a portion of metal pad 42B. Next, raised via 52 is formed through plating. Photo resist 88 is then removed.

Figure 25:
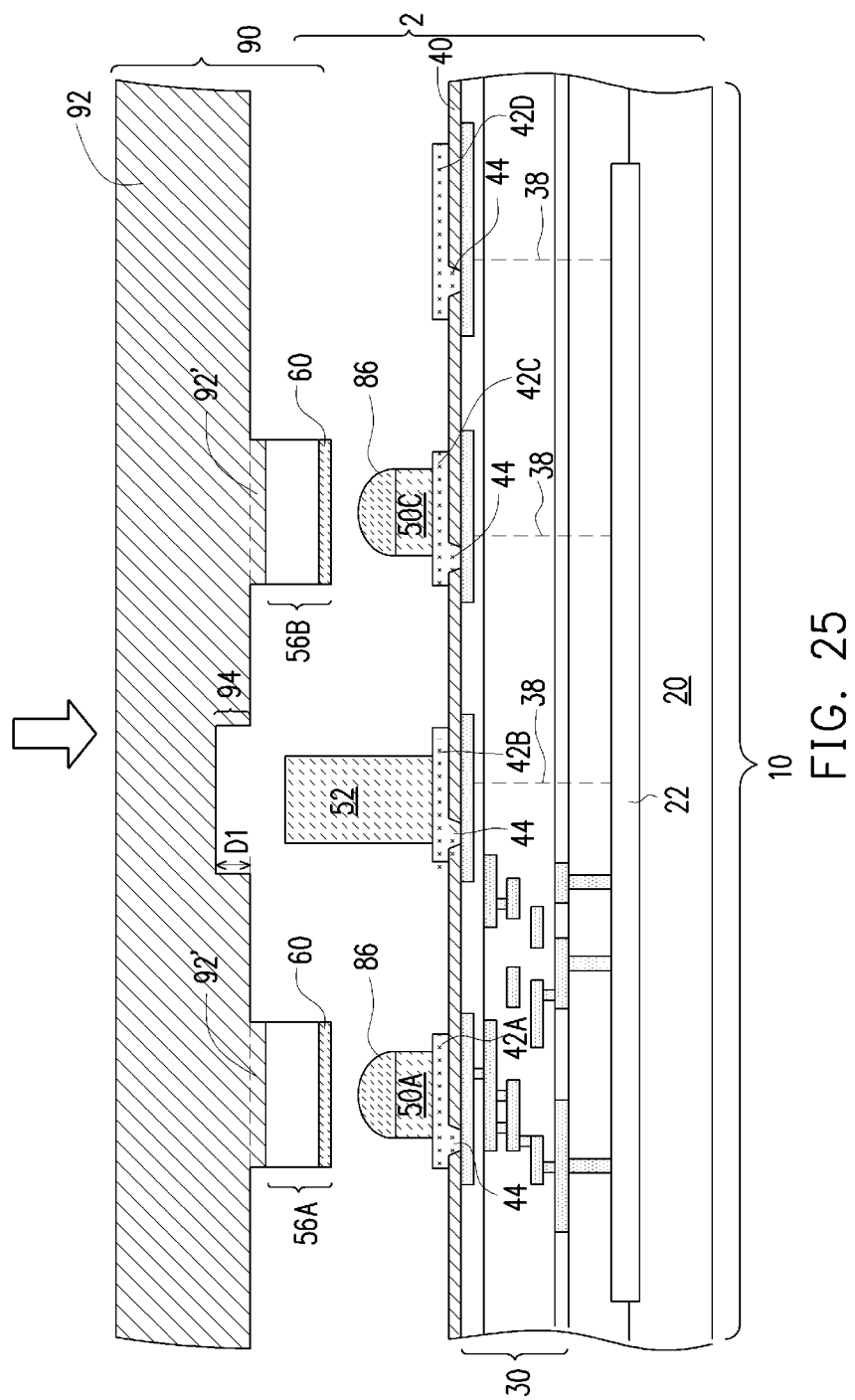
Figure 26:
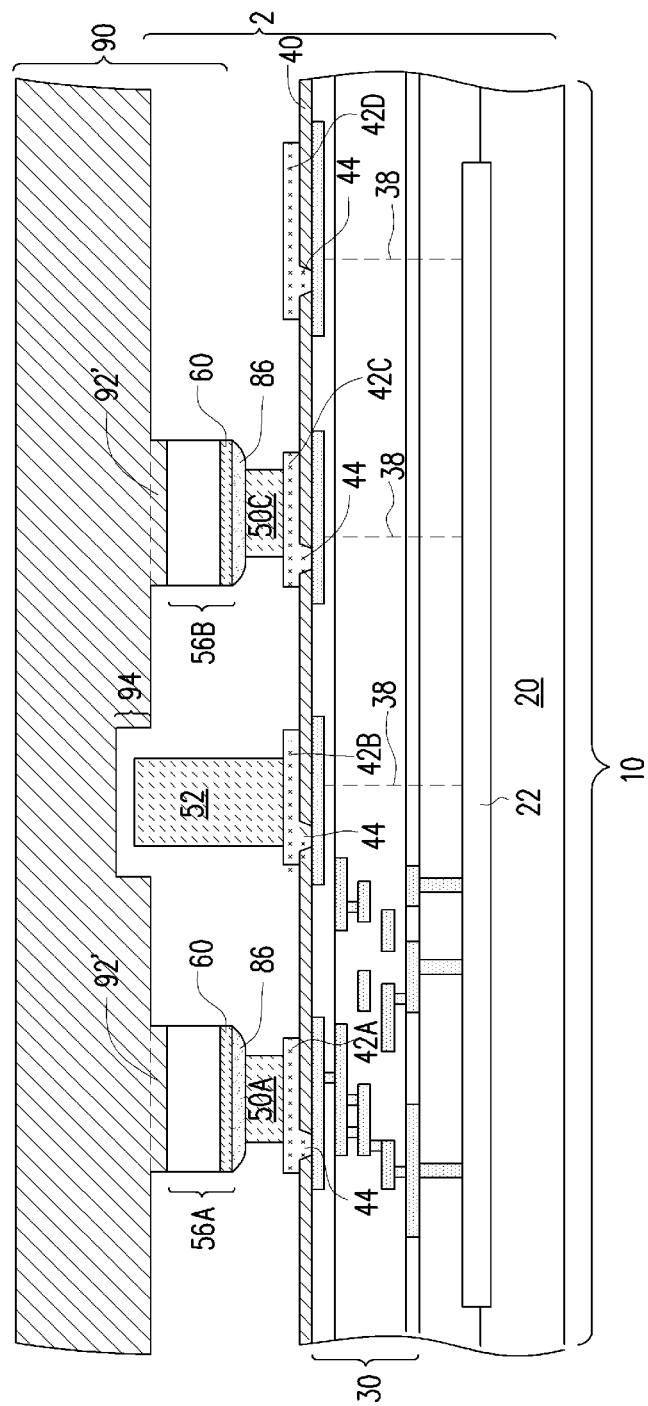

Next, as shown in FIG. 25, chip 90 is provided. Chip 90 includes substrate 92, and component devices 56A and 56B formed on substrate 92. In accordance with some embodiments, chip 90 is a discrete chip that has been sawed from a wafer. Accordingly, the bonding as shown in FIG. 26 is a die-to-wafer bonding. In accordance with alternative embodiments, chip 90 is a part of an unsawed wafer. Accordingly, the bonding as shown in FIG. 26 is a wafer-to-wafer bonding. Substrate 92 may be a silicon substrate, or may be formed of other materials such as a dielectric material (such as silicon oxide, silicon carbide, or the like). Chip 90 may include recess 94 extending into substrate 92. In accordance with some embodiments, the depth D1 of recess 94 may be in the range between about 5 μm and about 50 μm.

Chip 90 is aligned with the respective chip 10. Furthermore, bond layers 60 in component devices 56A and 56B are aligned to the respective bond pads 50A and 50C, respectively. Chip 90 is then put into contact with chip 10. A reflow is then performed, so that solder regions 86 bonds chip 10 and chip 90 together. In accordance with alternative embodiments, instead of bonding chips 10 and 90 through solder bonding, metal-to-metal (such as copper-to-copper) direct bonding is performed.

Figure 27:
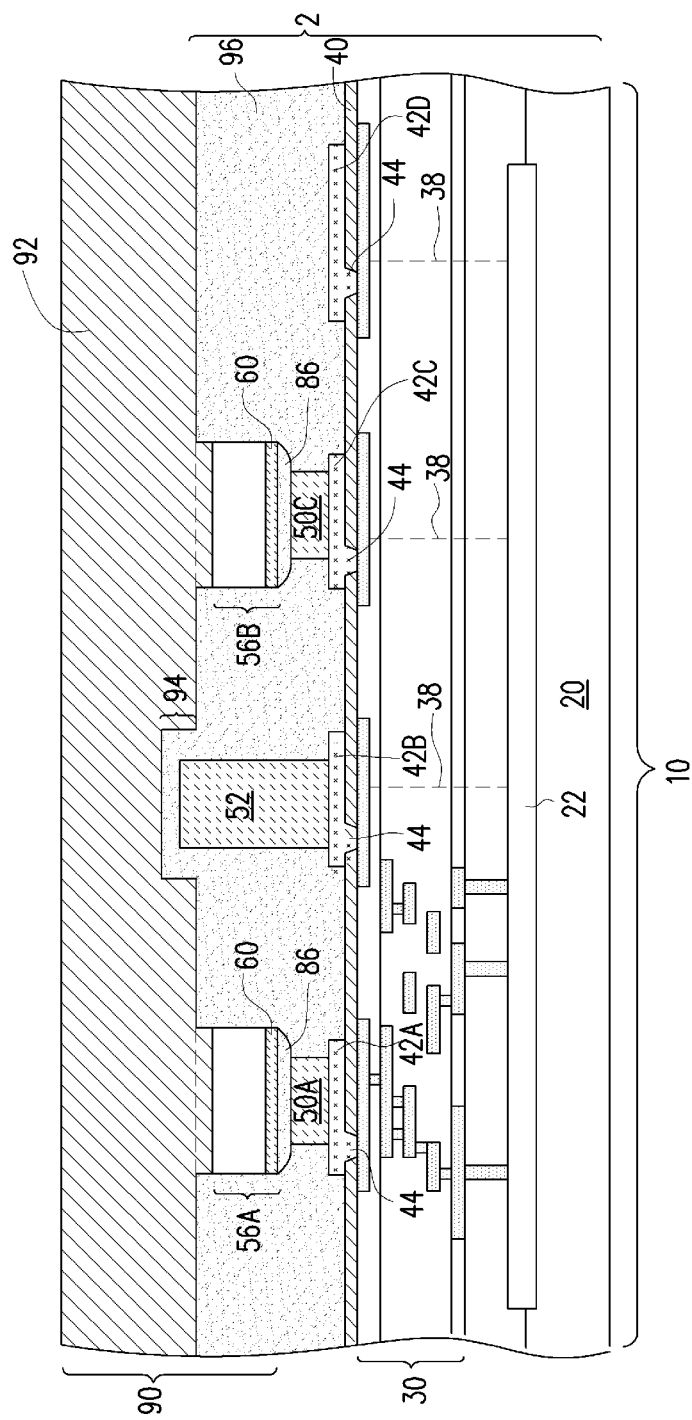
Figure 28:
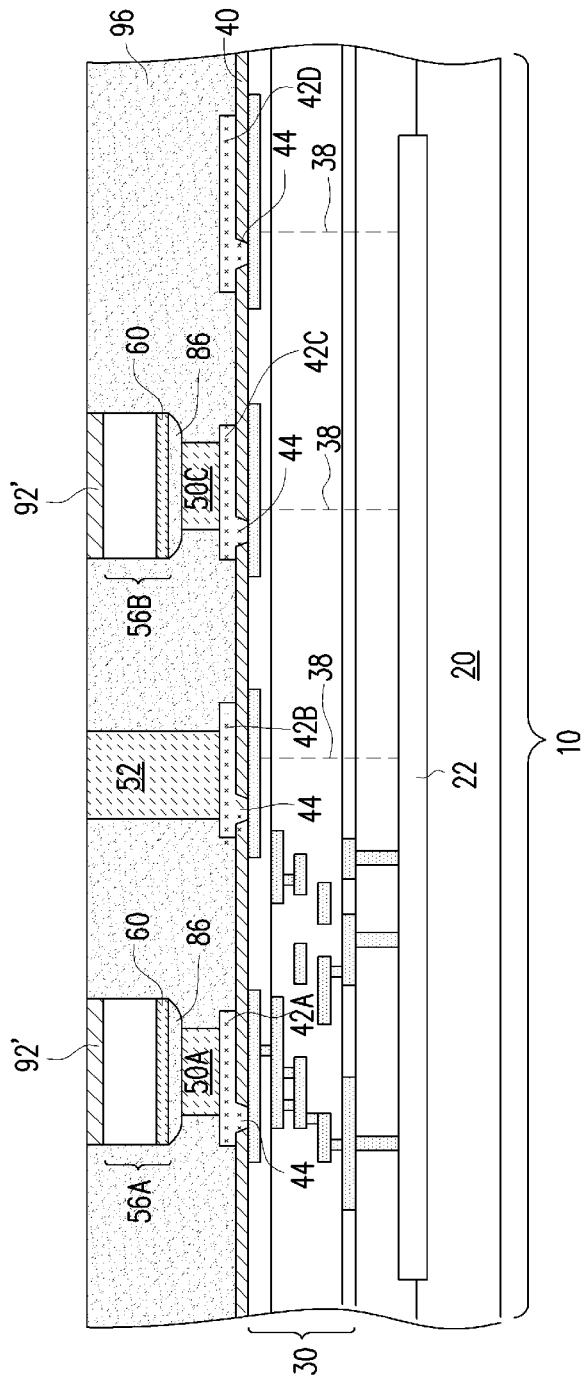

Referring to FIG. 27, encapsulating material 96 is disposed into the gap between chips 10 and 90. When chip 90 is a discrete chip, there will be a plurality of identical chips 90, each bonded to one of the underlying chips 10. Encapsulating material 96 may be an underfill or a molding underfill. Encapsulating material 96 also fills the recess 94 in substrate 92.

Next, a planarization step such as CMP or mechanical grinding is performed to reveal raised via 52. In accordance with some embodiments, remaining portions 92' of substrate 92 are left in order to provide some process margin, so that component devices 56A and 56B are not damaged even if over-polish occurs in the planarization step. In accordance with alternative embodiments, the top electrodes of component devices 56 are exposed after the planarization.

Figure 29:
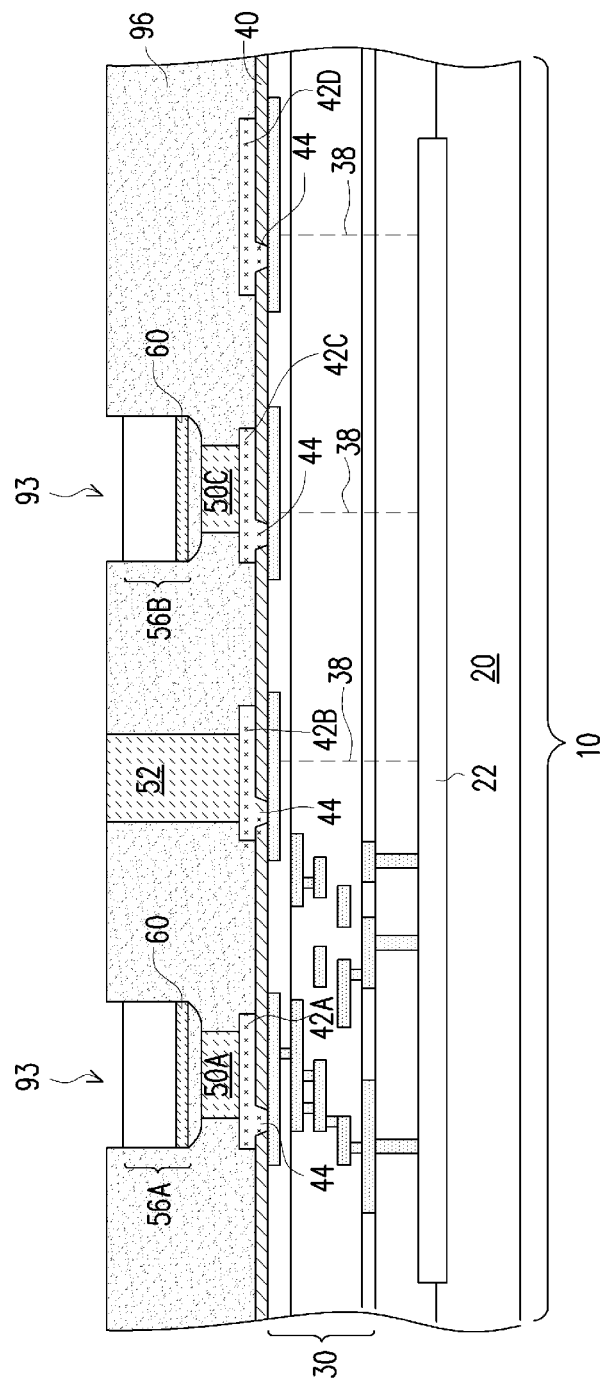

The remaining portions 92' are then removed in an etching step, and the remaining structure is illustrated in FIG. 29. In accordance with some embodiments, remaining portions 92' are silicon regions. In accordance with alternative embodiments, remaining portions 92' are formed of a material different from the removed substrate 92. For example, remaining portions 92' may be formed of silicon oxide, while substrate 92 may be formed of silicon.

Figure 30:
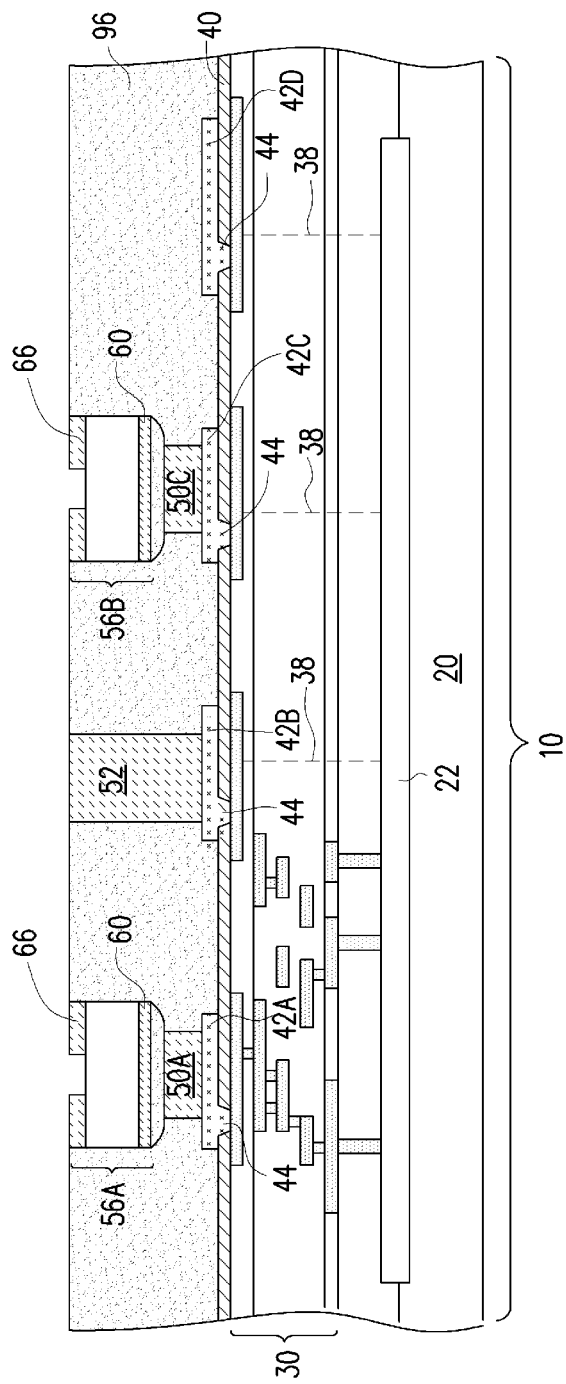
Figure 31:
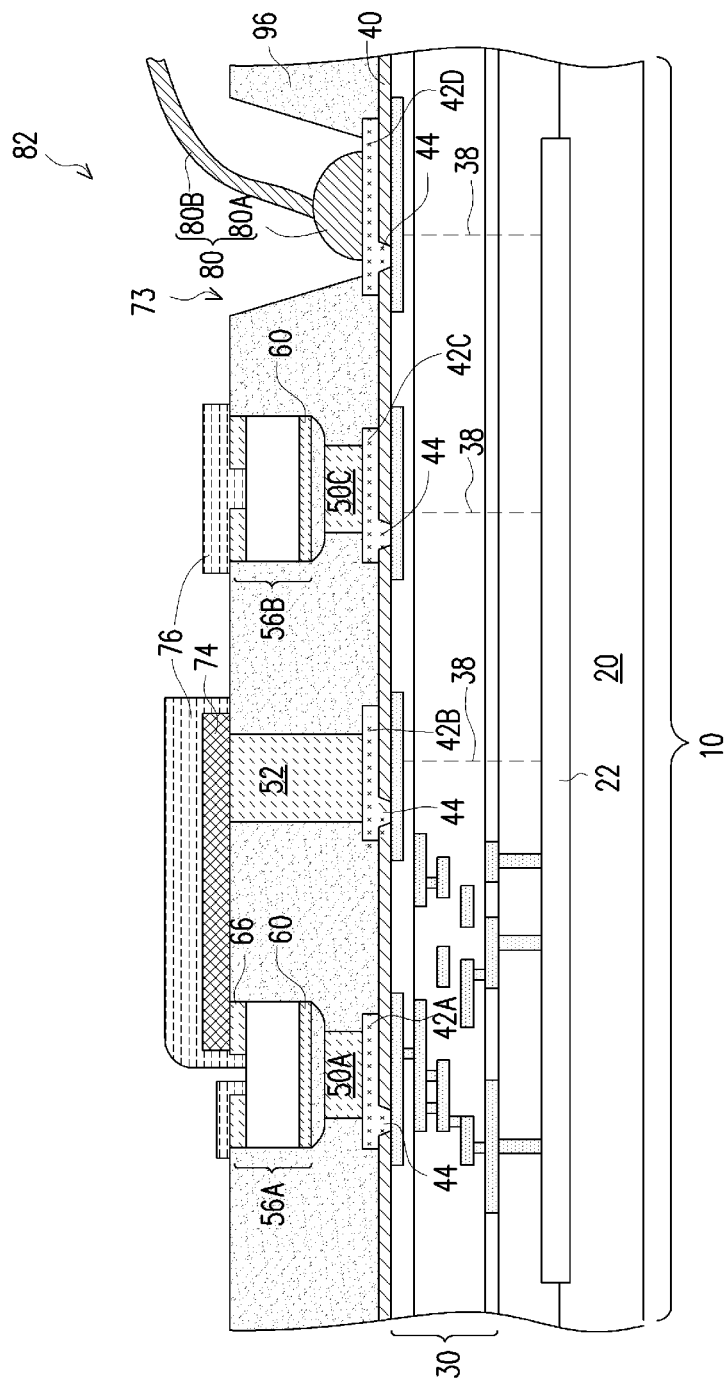

In a subsequent step, as shown in FIG. 30, top electrodes 66 are formed, as shown in FIG. 30. Redistribution line 74 and passivation layer 76 are then formed. After the formation of redistribution line 74 and passivation layer 76, opening 73 may be formed to expose bond pad 42D. Wire bond structure 80, which includes bond ball 80A and metal wire 80B, is then formed.

The embodiments of the present disclosure have some advantageous features. In order to connect to the top terminals of the component devices having terminals on opposite surfaces, electrical connections need to be made to connect to the top terminals. However, since the component devices are thick, it is difficult to form redistribution lines that are thick enough to span the height of the component devices. In accordance with some embodiments of the present disclosure, raised vias are formed to solve this problem. Furthermore, the raised vias may be formed starting from the same metal layer on which the component devices are to be bonded to, and hence the manufacturing cost is reduced.

In accordance with some embodiments of the present disclosure, a method includes forming a metal layer extending into openings of a dielectric layer to contact a first metal pad and a second metal pad, and bonding a bottom terminal of a component device to the metal layer. The metal layer has a first portion directly underlying and bonded to the component device. A raised via is formed on the metal layer, and the metal layer has a second portion directly underlying the raised via. The metal layer is etched to separate the first portion and the second portion of the metal layer from each other. The method further includes coating the raised via and the component device in a dielectric layer, revealing the raised via and a top terminal of the component device, and forming a redistribution line connecting the raised via to the top terminal.

In accordance with some embodiments of the present disclosure, a method includes forming a first bond pad and a second bond pad on a first metal pad and a second metal pad, respectively, bonding a bottom terminal of a discrete device die onto the first bond pad, and plating a raised via on the second bond pad. The raised via has a top surface substantially level with or higher than a top surface of the discrete device die. The method further includes coating the raised via and the discrete device die in a polymer layer, and forming a redistribution line connecting a top terminal of the discrete device die to a top surface of the raised via.

In accordance with some embodiments of the present disclosure, a device includes a first metal pad and a second metal pad at a same level, a first bond pad and a second bond pad over and contacting the first metal pad and the second metal pad, respectively, and a discrete passive device over the first bond pad. The discrete passive device has a bottom terminal and a top terminal, with the bottom terminal electrically coupling to the first bond pad. The device further includes a raised via over and contacting the second bond pad, and a redistribution line electrically coupling the top terminal of the discrete passive device to the raised via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a metal layer extending into openings of a dielectric layer to contact a first metal pad and a second metal pad;
   forming a component device overlapping a first portion of the metal layer, wherein the forming the component device comprises:
   depositing a conductive layer over the metal layer;
   depositing an insulator over the conductive layer; and
   patterning the conductive layer and the insulator;
   forming a raised via on the metal layer, wherein the metal layer has a second portion directly underlying the raised via;
   etching the metal layer to separate the first portion and the second portion of the metal layer from each other;
   encapsulating the raised via and the component device in an encapsulant;
   after the encapsulating, revealing the raised via and a top terminal of the component device in a same process; and
   forming a redistribution line connecting the raised via to the component device.

2. The method of claim 1, wherein the forming the component device further comprises:
   after the conductive layer and the insulator are patterned, forming an additional dielectric layer to embed remaining portions of the conductive layer and the insulator therein; and
   patterning the additional dielectric layer.

3. The method of claim 2, wherein the patterning the additional dielectric layer results in the metal layer to be revealed.

4. The method of claim 2 further comprising, before the conductive layer is deposited, forming a bottom terminal on the first portion of the metal layer.

5. The method of claim 1, wherein the raised via and the top terminal of the component device are revealed in a planarization process, and wherein top surfaces of the raised via, the top terminal, and the encapsulant are coplanar.

6. The method of claim 1, wherein the metal layer further comprises a third portion extending into an additional opening in the dielectric layer to contact a third metal pad, and the method further comprises:
   when the metal layer is etched, removing the third portion of the metal layer to expose the third metal pad; and
   forming a bond structure on the third metal pad.

7. The method of claim 1 further comprising planarizing the metal layer to form a planar top surface, wherein the component device and the raised via are formed on the planar top surface.

8. The method of claim 1, wherein the same process comprises etching the encapsulant.

9. A method comprising:
   forming a first dielectric layer to cover edge portions of a first metal pad;
   depositing a metal layer, wherein the metal layer comprises a first portion extending into an opening in the first dielectric layer to contact the first metal pad, and a second portion overlapping a portion of the first dielectric layer;
   forming a bottom terminal on the first portion of the metal layer;
   forming a capacitor overlapping the bottom terminal;
   forming a raised via on a third portion of the metal layer;
   encapsulating the raised via and the capacitor in an encapsulant;
   revealing a top terminal of the capacitor and the raised via; and
   electrically connecting the top terminal to the raised via.

10. The method of claim 9 further comprising, after the metal layer is deposited, planarizing the metal layer.

11. The method of claim 9, wherein the forming the capacitor comprises:
    depositing a bottom capacitor electrode, an insulator over the bottom capacitor electrode, and a top capacitor electrode over the insulator layer-by-layer; and
    patterning the bottom capacitor electrode, the insulator, and the top capacitor electrode.

12. The method of claim 9 further comprising planarizing the encapsulant until both of the top terminal of the capacitor and the raised via are exposed.

13. The method of claim 9 further comprising etching the metal layer to remove a portion of the metal layer between the capacitor and the raised via.

14. The method of claim 9 further comprising etching-through the encapsulant to reveal a second metal pad.

15. The method of claim 14 further comprising forming a wire bond on the second metal pad.

16. A method comprising:
    forming a metal layer comprising a planar top surface, wherein the metal layer comprises a first via portion and a second via portion extending through an underlying dielectric layer to contact a first metal pad and a second metal pad, respectively;
    forming a passive device on the metal layer and overlapping the first via portion;
    forming a raised via on the metal layer and overlapping the second via portion, wherein the raised via is electrically connected to a bottom terminal of the passive device, and wherein a top end of the passive device and the raised via are at a same level, and the passive device and the raised via have substantially a same height;
    etching a portion of the metal layer, with the portion of the metal layer connecting the first via portion to the second via portion being removed in the etching; and
    electrically connecting a top terminal of the passive device to the raised via.

17. The method of claim 16, wherein after the metal layer is etched, the underlying dielectric layer is exposed.

18. The method of claim 16 further comprising forming an encapsulant encapsulating the passive device and the raised via therein.

19. The method of claim 18 further comprising forming a wire bond in the encapsulant.

20. The method of claim 16 further comprising forming a dielectric layer on sidewalls of the passive device, wherein the etching a portion of the metal layer is performed after the dielectric layer is formed.

\* \* \* \* \*